United States Patent
Yu et al.

(10) Patent No.: US 11,211,336 B2
(45) Date of Patent: Dec. 28, 2021

(54) INTEGRATED FAN-OUT PACKAGE AND METHOD FOR FABRICATING THE SAME

(71) Applicant: Taiwan Semiconductor Manufacturing Co., Ltd., Hsinchu (TW)

(72) Inventors: Chen-Hua Yu, Hsinchu (TW); Chun-Hui Yu, Hsinchu County (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/671,188

(22) Filed: Nov. 1, 2019

(65) Prior Publication Data

US 2020/0066642 A1 Feb. 27, 2020

Related U.S. Application Data

(63) Continuation of application No. 15/676,958, filed on Aug. 14, 2017, now Pat. No. 10,475,747.

(51) Int. Cl.
*H01L 23/538* (2006.01)
*H01L 25/065* (2006.01)
(Continued)

(52) U.S. Cl.
CPC ........ *H01L 23/5386* (2013.01); *H01L 21/486* (2013.01); *H01L 21/4853* (2013.01);
(Continued)

(58) Field of Classification Search
CPC ............. H01L 23/5386; H01L 23/3128; H01L 23/367; H01L 23/5383; H01L 23/5384; H01L 1121/4853; H01L 23/4857; H01L 23/486; H01L 23/561; H01L 1124/97; H01L 25/0652; H01L 25/50
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Sitaramarao S Yechuri
(74) *Attorney, Agent, or Firm* — JCIPRNET

(57) ABSTRACT

An integrated fan-out package includes an integrated circuit, a plurality of semiconductor devices, a first redistribution circuit structure, and an insulating encapsulation. The integrated circuit has an active surface and a rear surface opposite to the active surface. The semiconductor devices are electrically connected the integrated circuit. The first redistribution circuit structure is disposed between the integrated circuit and the semiconductor devices. The first redistribution circuit structure is electrically connected to the integrated circuit and the semiconductor devices respectively. The first redistribution circuit structure has a first surface, a second surface opposite to the first surface, and lateral sides between the first surface and the second surface. The insulating encapsulation encapsulates the integrated circuit and the semiconductor devices and covers the first surface and the second surface of the first redistribution circuit structure. Furthermore, methods for fabricating the integrated fan-out package are also provided.

20 Claims, 26 Drawing Sheets

(51) Int. Cl.
| | |
|---|---|
| *H01L 23/367* | (2006.01) |
| *H01L 25/00* | (2006.01) |
| *H01L 21/56* | (2006.01) |
| *H01L 21/48* | (2006.01) |
| *H01L 23/00* | (2006.01) |
| *H01L 23/31* | (2006.01) |
| *H01L 21/683* | (2006.01) |
| *H01L 21/78* | (2006.01) |

(52) U.S. Cl.
CPC ........ *H01L 21/4857* (2013.01); *H01L 21/561* (2013.01); *H01L 21/6835* (2013.01); *H01L 23/3128* (2013.01); *H01L 23/367* (2013.01); *H01L 23/5384* (2013.01); *H01L 23/5385* (2013.01); *H01L 23/5389* (2013.01); *H01L 24/19* (2013.01); *H01L 24/20* (2013.01); *H01L 24/97* (2013.01); *H01L 25/0652* (2013.01); *H01L 25/50* (2013.01); H01L 21/565 (2013.01); H01L 21/568 (2013.01); H01L 21/78 (2013.01); H01L 23/5383 (2013.01); H01L 24/16 (2013.01); H01L 24/32 (2013.01); H01L 24/73 (2013.01); H01L 2221/68359 (2013.01); H01L 2224/0401 (2013.01); H01L 2224/04105 (2013.01); H01L 2224/12105 (2013.01); H01L 2224/16227 (2013.01); H01L 2224/32225 (2013.01); H01L 2224/73204 (2013.01); H01L 2224/73267 (2013.01); H01L 2224/81005 (2013.01); H01L 2224/83005 (2013.01); H01L 2224/92244 (2013.01); H01L 2224/95001 (2013.01); H01L 2224/97 (2013.01); H01L 2225/06517 (2013.01); H01L 2225/06548 (2013.01); H01L 2225/06572 (2013.01); H01L 2225/06586 (2013.01); H01L 2225/06589 (2013.01); H01L 2924/1434 (2013.01); *H01L 2924/1531* (2013.01); *H01L 2924/351* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0037950 A1* | 2/2013 | Yu ................ H01L 23/3121 257/738 |
| 2013/0062761 A1* | 3/2013 | Lin ................ H01L 21/565 257/738 |
| 2013/0075902 A1* | 3/2013 | Chow .............. H01L 21/56 257/737 |
| 2014/0015131 A1* | 1/2014 | Meyer ............. H01L 21/561 257/738 |
| 2014/0134804 A1* | 5/2014 | Kelly ............. H01L 21/68735 438/118 |
| 2016/0093572 A1* | 3/2016 | Chen .............. H01L 21/486 257/774 |
| 2016/0155695 A1* | 6/2016 | Shen ............. H01L 23/49838 257/676 |
| 2016/0233196 A1* | 8/2016 | Kim ............... H01L 24/81 |
| 2016/0260684 A1* | 9/2016 | Zhai .............. H01L 21/568 |
| 2016/0315071 A1* | 10/2016 | Zhai .............. H01L 24/24 |
| 2017/0011993 A1* | 1/2017 | Zhao ............. H01L 23/49811 |
| 2017/0084589 A1* | 3/2017 | Kuo .............. H01L 23/3128 |
| 2017/0141088 A1* | 5/2017 | Zhai ............. H01L 23/5389 |
| 2017/0358560 A1* | 12/2017 | Kim ............. H01L 23/3128 |
| 2018/0061813 A1* | 3/2018 | Hsieh ............ H01L 23/28 |
| 2018/0076179 A1* | 3/2018 | Hsu .............. H01L 24/17 |

* cited by examiner

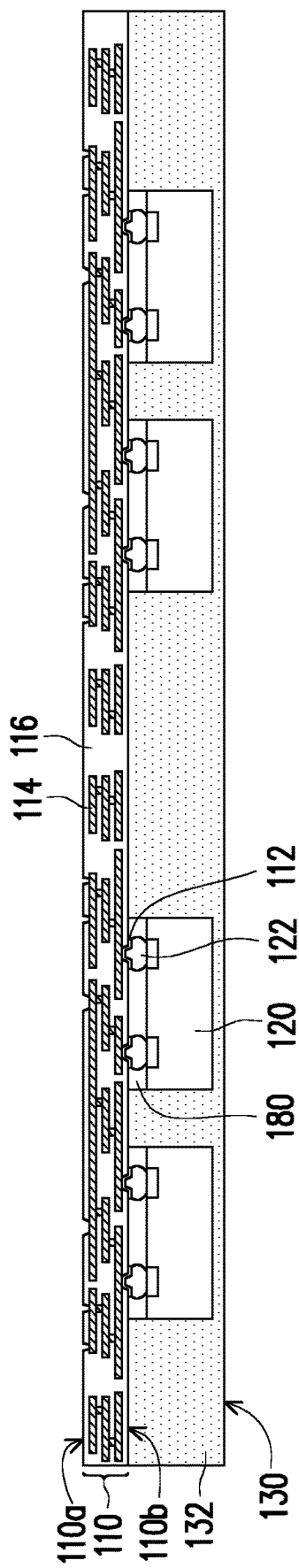
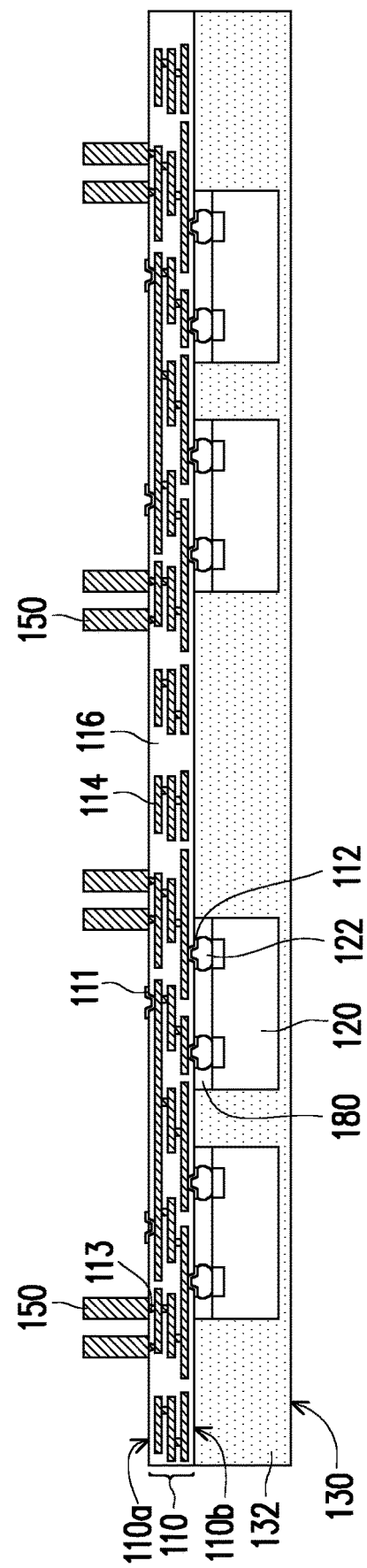

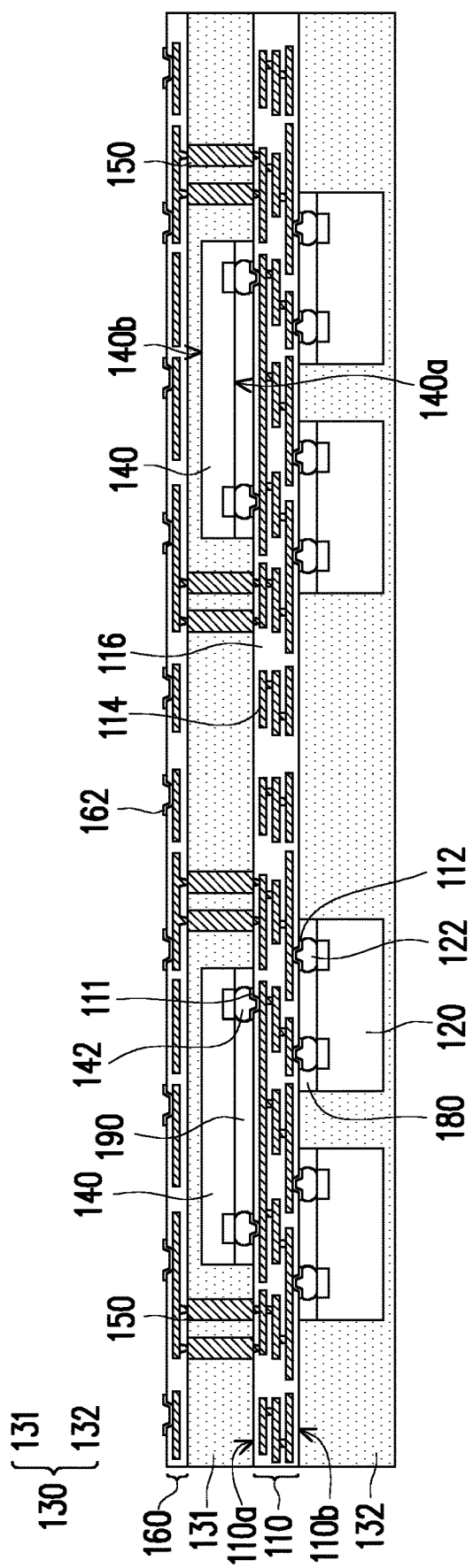
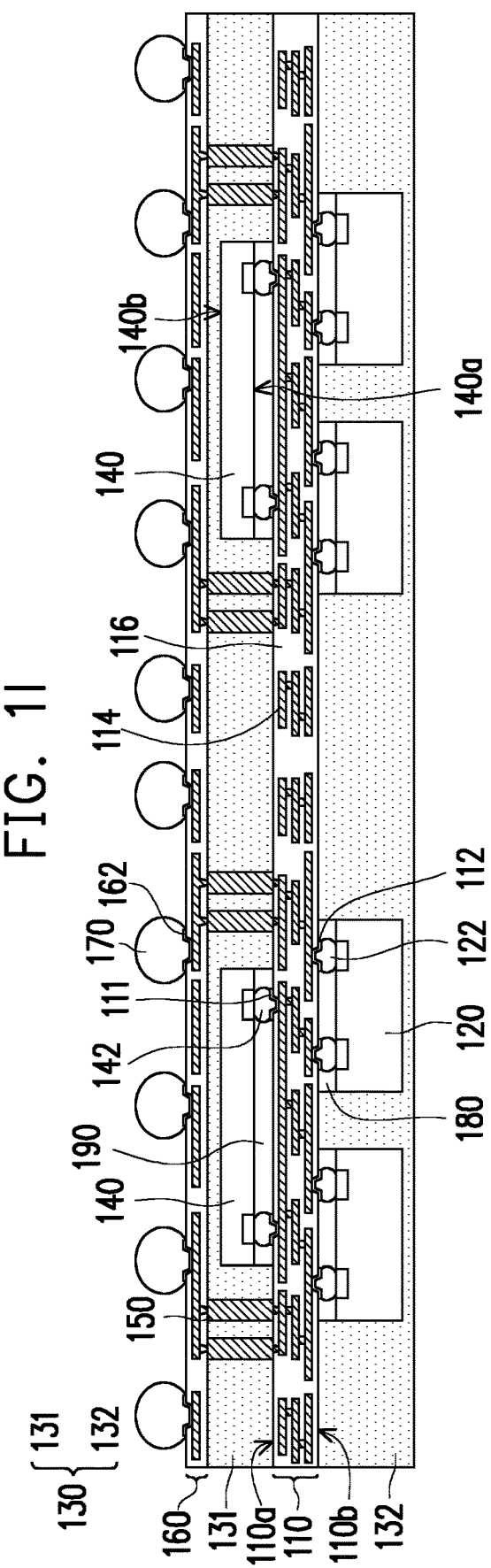
FIG. 1I
FIG. 1J

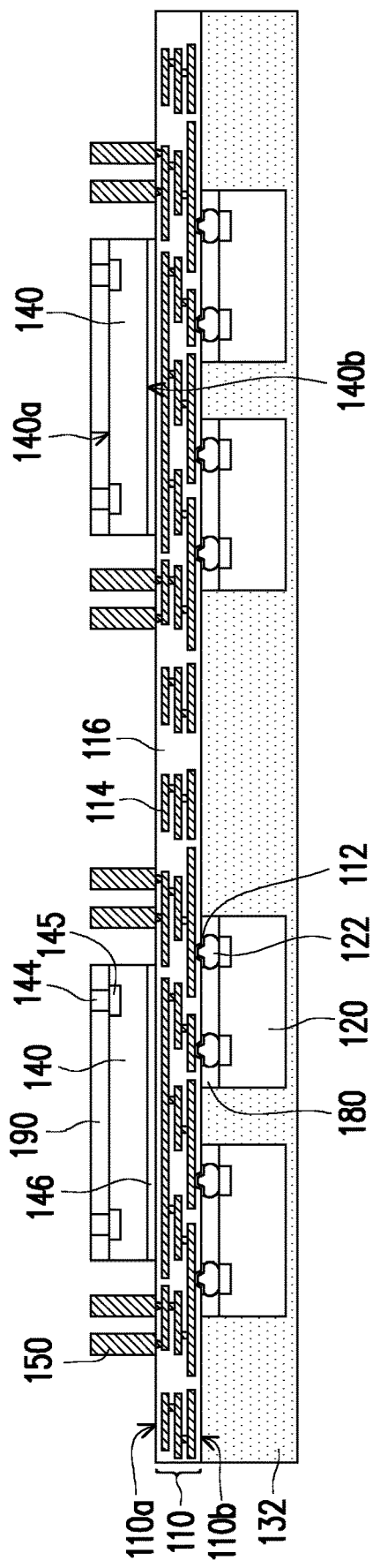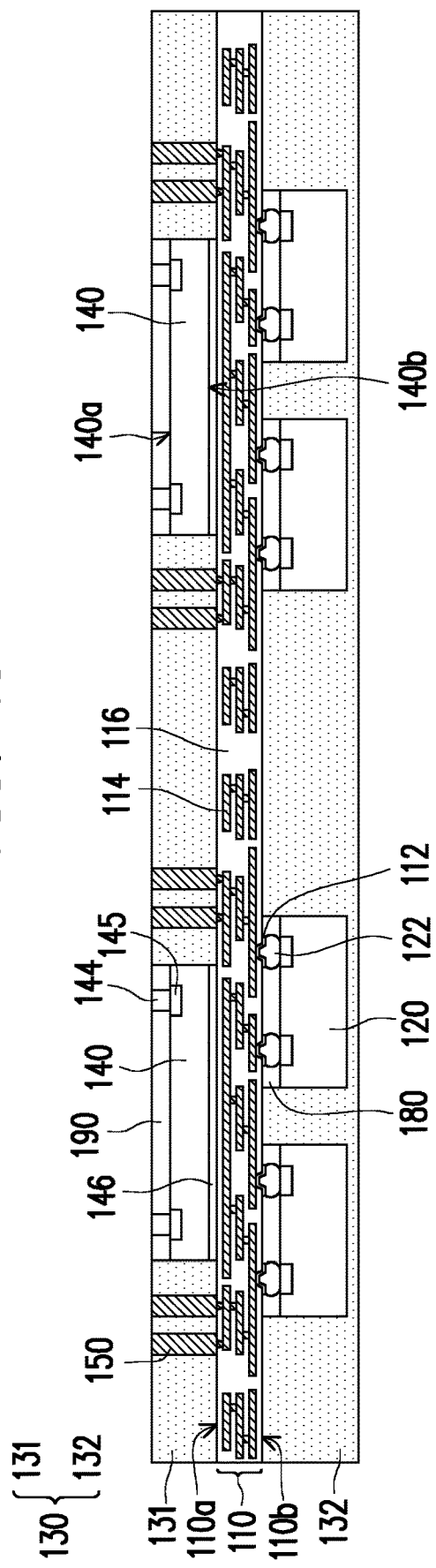

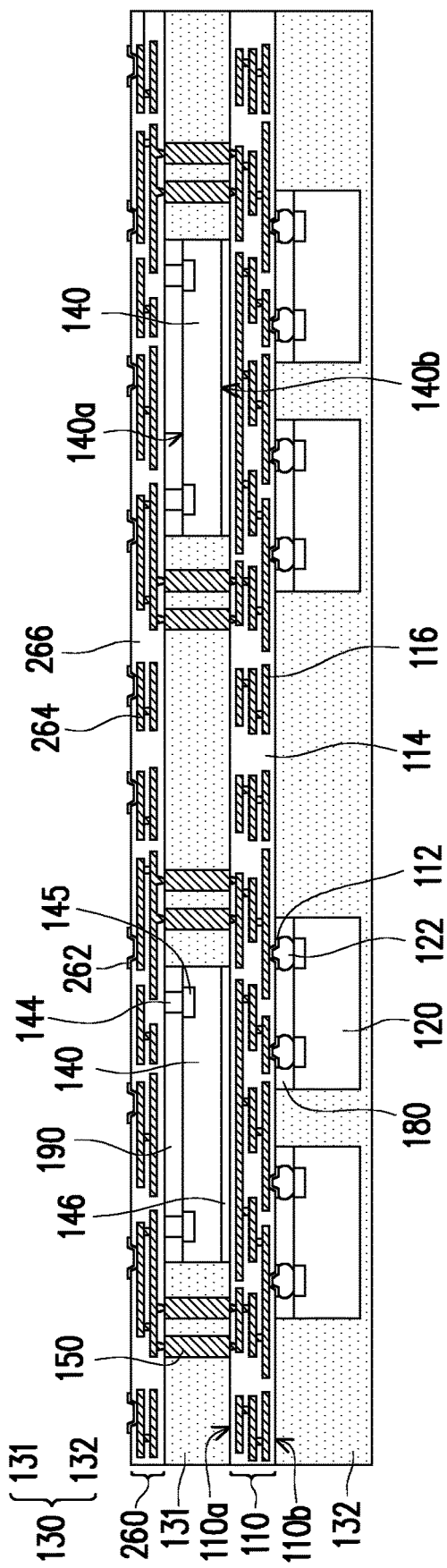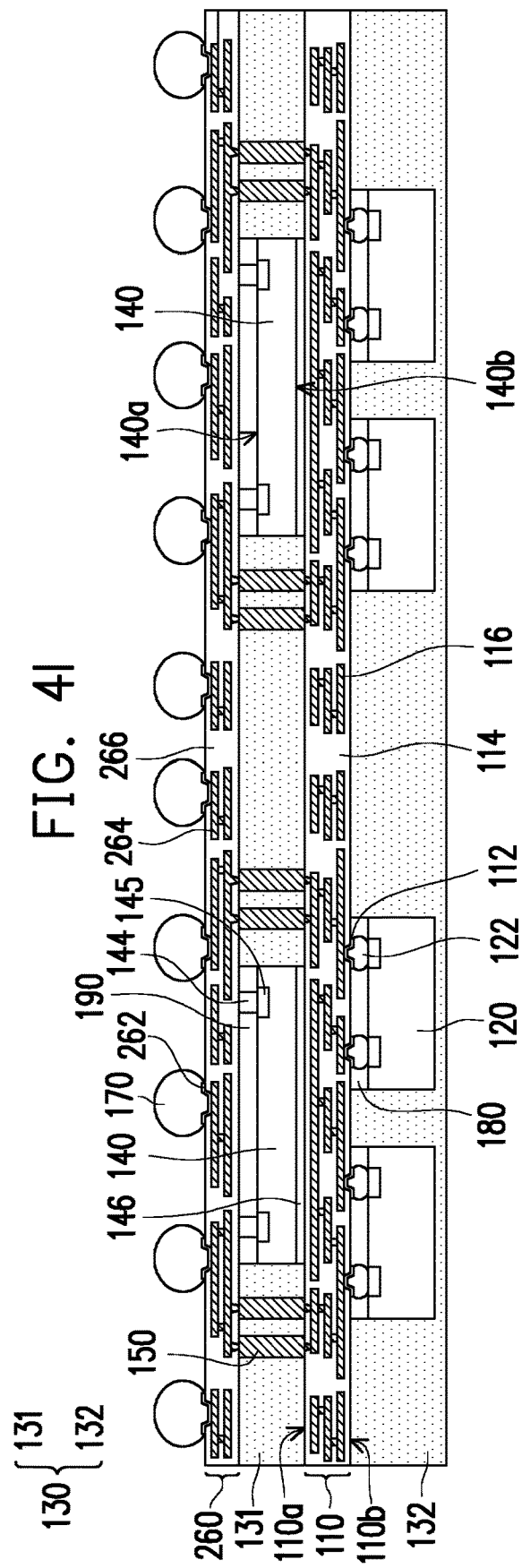

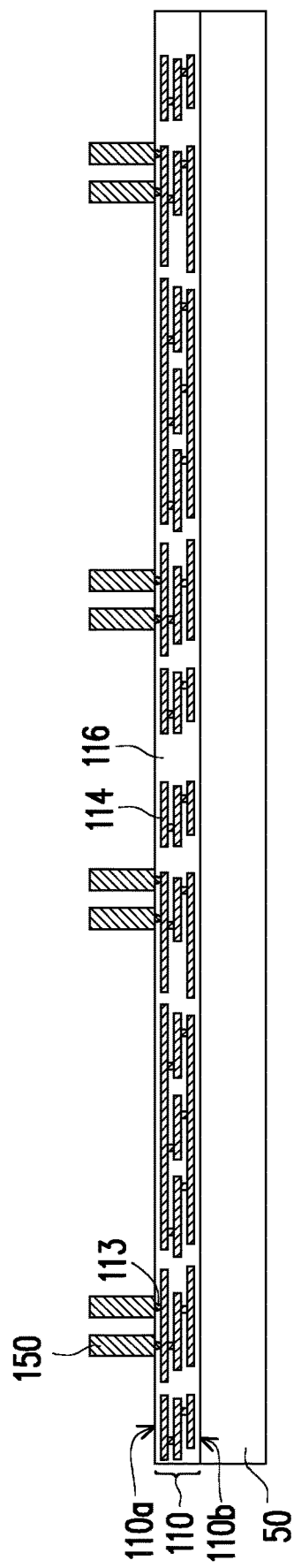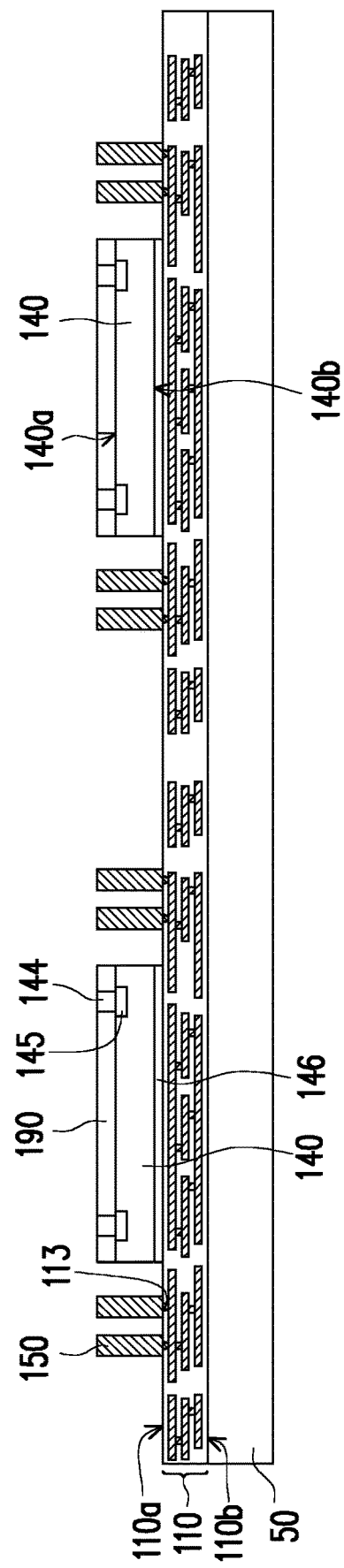

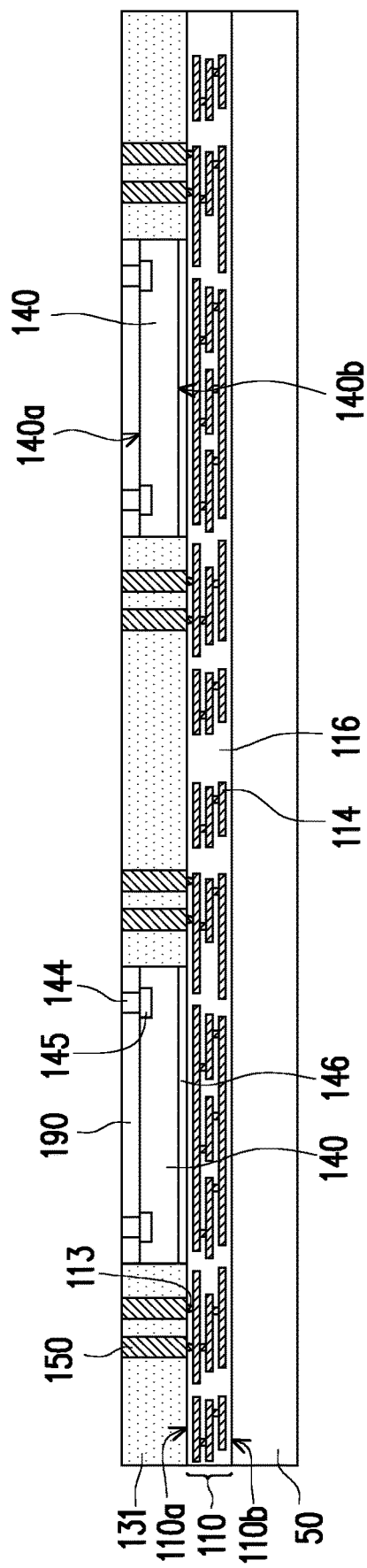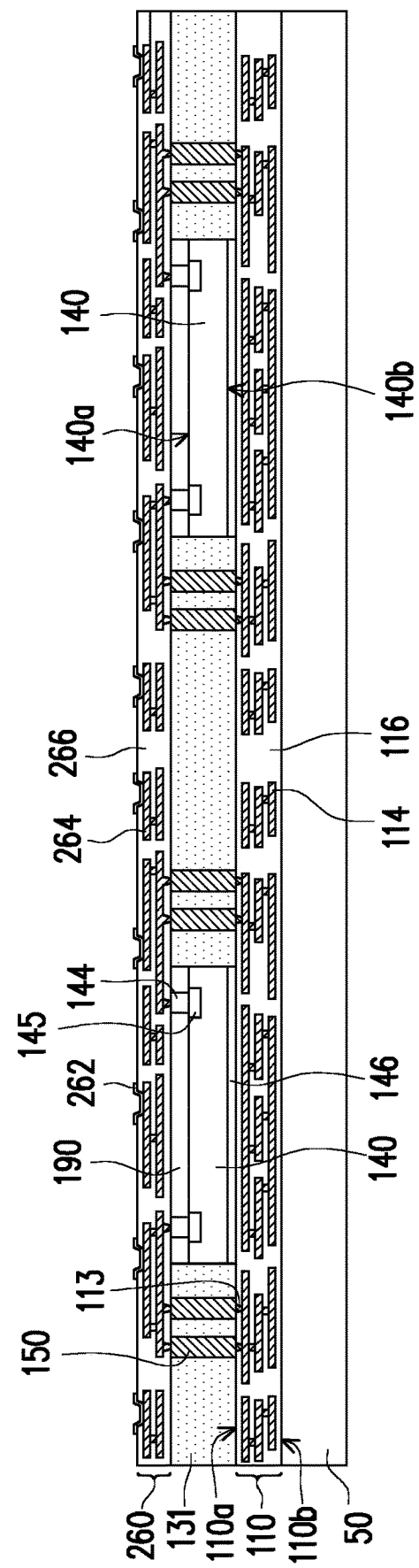

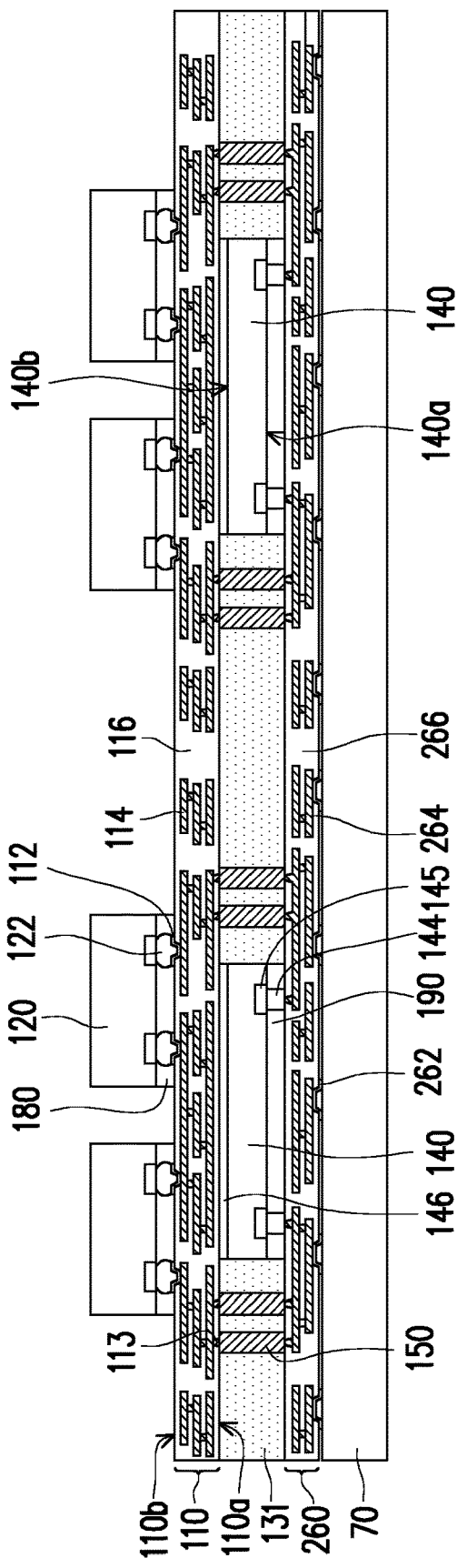
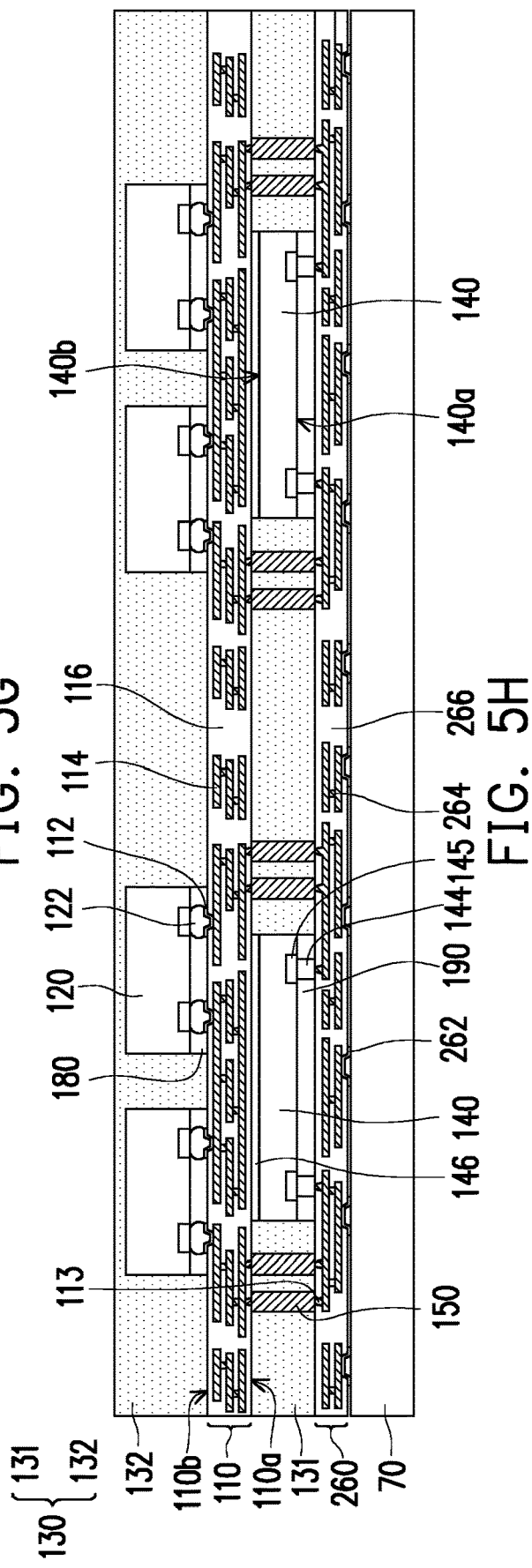
FIG. 5G
FIG. 5H

INTEGRATED FAN-OUT PACKAGE AND METHOD FOR FABRICATING THE SAME

CROSS-REFERENCE TO RELATED APPLICATION

This is a continuation application of and claims the priority benefit of U.S. application Ser. No. 15/676,958, filed on Aug. 14, 2017, now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuously reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness to deliver merits of low power consumption, high performance, small package footprint, and competitive cost. How to shrinkage the area or thickness of the package, to enhance the performance of the integrated fan-out packages, particularly in the area of high density, high power applications, is an important goal of this patent focus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1K illustrate a process flow for fabricating integrated fan-out packages in accordance with some embodiments.

FIG. 4A through FIG. 4K illustrate a process flow for fabricating integrated fan-out packages in accordance with some embodiments.

FIG. 5A through FIG. 5J illustrate a process flow for fabricating integrated fan-out packages in accordance with some embodiments.

DETAILED DESCRIPTION

Figure 1A:
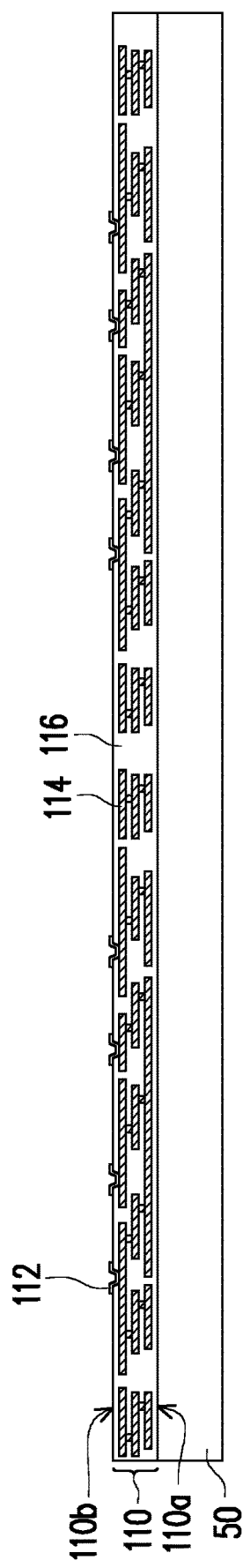

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A through FIG. 1K illustrate a process flow for fabricating integrated fan-out packages in accordance with some embodiments. Referring to FIG. 1A, a carrier 50 is provided and a first redistribution circuit structure 110 is formed thereon. The first redistribution circuit structure 110 has a first surface 110a and a second surface 110b disposed opposite to the first surface 110a. A plurality of conductive terminals 112 may be formed corresponding to the recesses on the second surface 110b of the first redistribution circuit structure 110 for the subsequent processes. The recesses on the second surface 110b are formed by a laser etching process or a lithography process, for example. As shown in FIG. 1A, the first redistribution circuit structure 110 may include a dielectric layer 116 and a plurality of patterned trace layers 114.

In some embodiments, the carrier 50 includes a de-bonding layer (not illustrated) formed thereon and adhered to the first surface 110a of the first redistribution circuit structure 110. The carrier 50 may be a glass substrate, and the de-bonding layer may be a light-to-heat conversion (LTHC) release layer formed on the glass substrate. The material of the carrier 50 and the above-mentioned de-bonding layer are not limited in this disclosure.

Figure 1B:
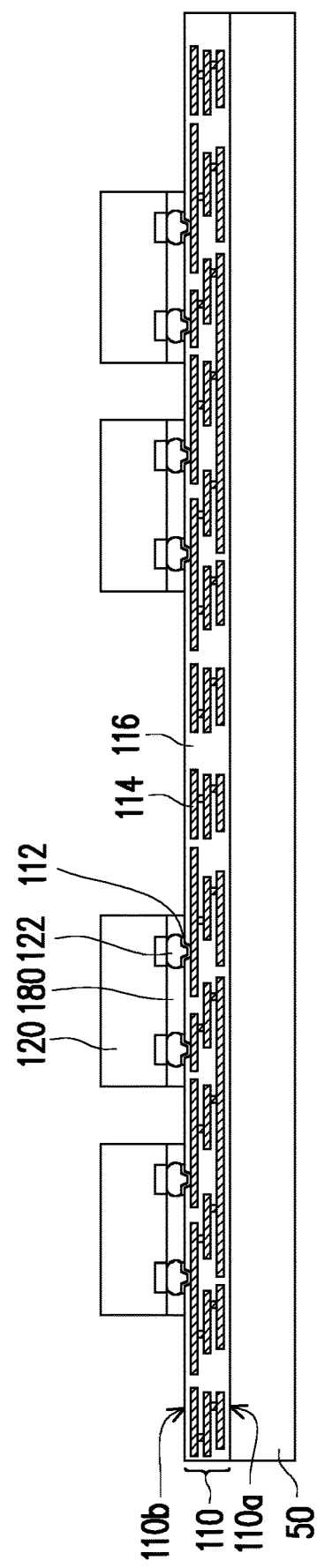

Referring to FIG. 1B, a plurality of memory devices 120 are mounted onto the second surface 110b of the first redistribution circuit structure 110 and electrically connected thereto through the conductive terminals 112 by a flip-chip bonding process and an underfill process, for example. In some embodiments, the memory devices 120 may include a plurality of bumps 122 bonded to the conductive terminals 112 for electrically connecting the memory devices 120 to the first redistribution circuit structure 110. As shown in FIG. 1B, an underfill 180 may be filled between the memory devices 120 and the second surface 110b of the first redistribution circuit structure 110 to cover and to insulate the bumps 122 and the conductive terminals 112. In the present embodiment, the configurations of the memory devices 120 can be a single die and/or a multiple stacked dies, such as High Bandwidth Memory (HBM) or Wide I/O. In other embodiments not illustrated, the memory device 120 can also be other functional semiconductor devices, such as logic devices, power management integrated circuits (PMICs), analog devices, sensors, integrated passive devices (IPDs) and/or components such as discrete passive components.

Referring to 1C, an insulating encapsulation 130 may be formed by an over-molding process and a grinding process over the second surface 110b of the first redistribution circuit structure 110. In some embodiments, the material of the insulating encapsulation 130 may be a molding compound formed by a molding process. The material of the insulating encapsulation 130 may include epoxy or other suitable materials.

Figure 1C:
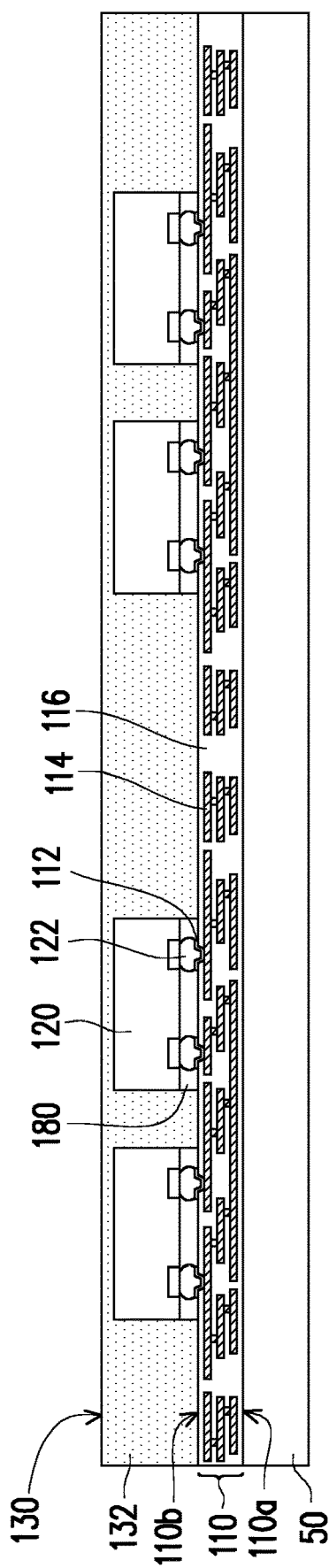

As shown in FIG. 1C, the insulating material is formed to entirely encapsulate the memory devices 120 by an over-molding process, and the insulating material is then grinded by a mechanical grinding process and/or a chemical mechanical polishing (CMP) process until the insulating encapsulation 130 having the desired thickness. In some embodiments, the insulating material may be continuously grinded until the top surfaces of the memory devices 120 are exposed. In some alternative embodiments, the top surface of the insulating encapsulation 130 may be co-planar with the top surfaces of the memory devices 120.

Figure 1D:
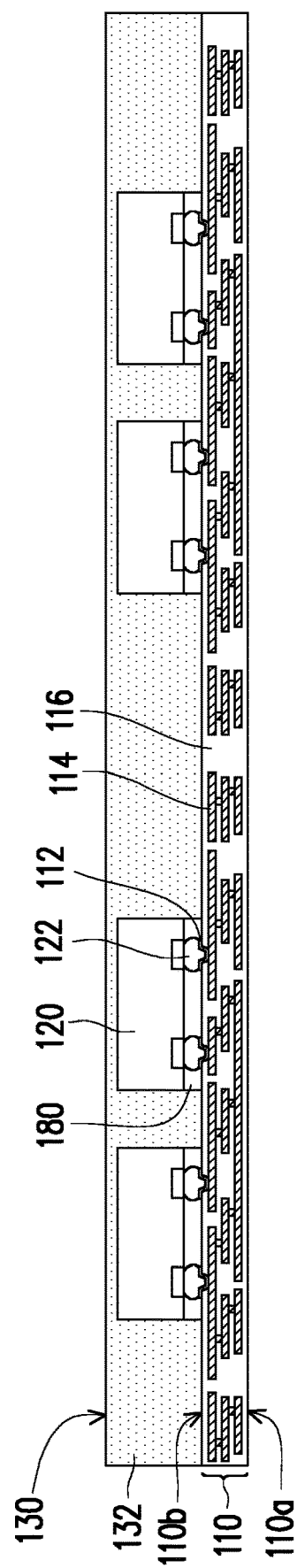

Referring to FIG. 1D, the carrier 50 and the above-mentioned de-bonding layer disposed thereon is de-bonded from the first surface 110a of the first redistribution circuit structure 110. In some embodiments, the de-bonding layer (e.g., LTHC release layer) may be irradiated by an UV laser, such that the first redistribution circuit structure 110 is separated from the de-bonding layer and the carrier 50.

Referring to FIG. 1E, a plurality of recesses may be formed on the first surface 110a of the first redistribution circuit structure 110 through a laser etching process, for example, and the recesses may be exposed by the dielectric layer 116 for the subsequent processes.

Referring to FIG. 1F, a plurality of conductive terminals 111, formed by an under-bump metallurgy (UBM) layer, for example, and a plurality of conductive pads 113 may be formed on the first surface 110a of the first redistribution circuit structure 110. Moreover, a plurality of conductive pillars 150 are formed on the first surface 110a of the first redistribution circuit structure 110 and electrically connected thereto respectively through the conductive pads 113. In some embodiments, the conductive pillars 150 are formed by a plating process. The plating process of the conductive pillars 150 is described in detail as following. First, a seed layer is sputtered onto the first surface 110a of the first redistribution circuit structure 110. A patterned photoresist layer (not illustrated) is then formed over the seed layer by photolithography, wherein the patterned photoresist layer exposes portions of the seed layer that are corresponding to the conductive pillars 150. Subsequently, a plating process is performed to form the conductive pillars 150 on the exposed portions of the seed layer. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the first surface 110a of the first redistribution circuit structure 110 is exposed. The above-mentioned plating process of fabricating the conductive pillars 150 is merely for illustration, which construes no limitations to the present disclosure.

Figure 1G:
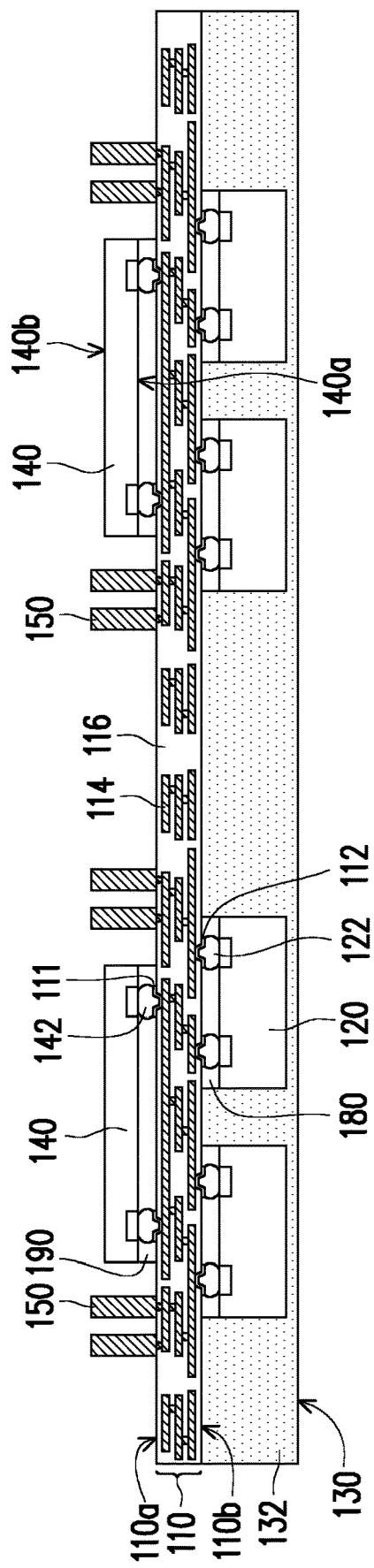

Referring to FIG. 1G, a plurality of integrated circuits 140 may be respectively mounted onto the first surface 110a of the first redistribution circuit structure 110 and disposed among the conductive pillars 150 through a plurality bumps 142 thereof and the conductive terminals 111 formed on the first surface 110a. As shown in FIG. 1G, the bumps 142 of the respective integrated circuits 140 are bonded to the conductive terminals 111 formed by an under-bump metallurgy (UBM) layer, for example, so as to electrically connect the respective integrated circuit 140 to the first redistribution circuit structure 110. In some embodiments, the integrated circuits 140 are bonded to the first redistribution circuit structure 110 by a flip-chip bonding process.

Moreover, to enhance the bonding reliability of the conductive terminals 111, in some embodiments, an underfill 190 is filled between the integrated circuits 140 and the first surface 110a of the first redistribution circuit structure 110. The underfill 190 encapsulates the conductive terminals 111 and the bumps 142 of the integrated circuits 140 to secure the structural integrity of the bumps 142, the conductive terminals 111 and its bonding interfaces at the first redistribution circuit structure 110 due to the coefficient of thermal expansion (CTE) mismatch between the first redistribution circuit structure 110 and the integrated circuits 140. In other words, the shearing stress resulted from CTE mismatch may be absorbed by the underfill 190 and the conductive terminals 111 can be protected by the underfill 190.

Each integrated circuit 140 may include an active surface 140a and a rear surface 140b opposite to the active surface 140a. In some embodiments, the integrated circuit 140 may be a system on chip (SOC) integrated circuit. As illustrated in FIG. 1G, the active surface 140a of the integrated circuit faces the first redistribution circuit structure 110 and memory devices 120. That is, in the present embodiment, the integrated circuits 140 and the memory devices 120 may be disposed in a face to face manner, and thereby the integrated circuits 140 may be electrically connected to the respective memory devices 120 directly through the first redistribution circuit structure 110. Accordingly, the conductive path between the memory devices 120 and the integrated circuits 140 may be greatly shortened, so as to reduce the curtail the power consumption.

Figure 1H:
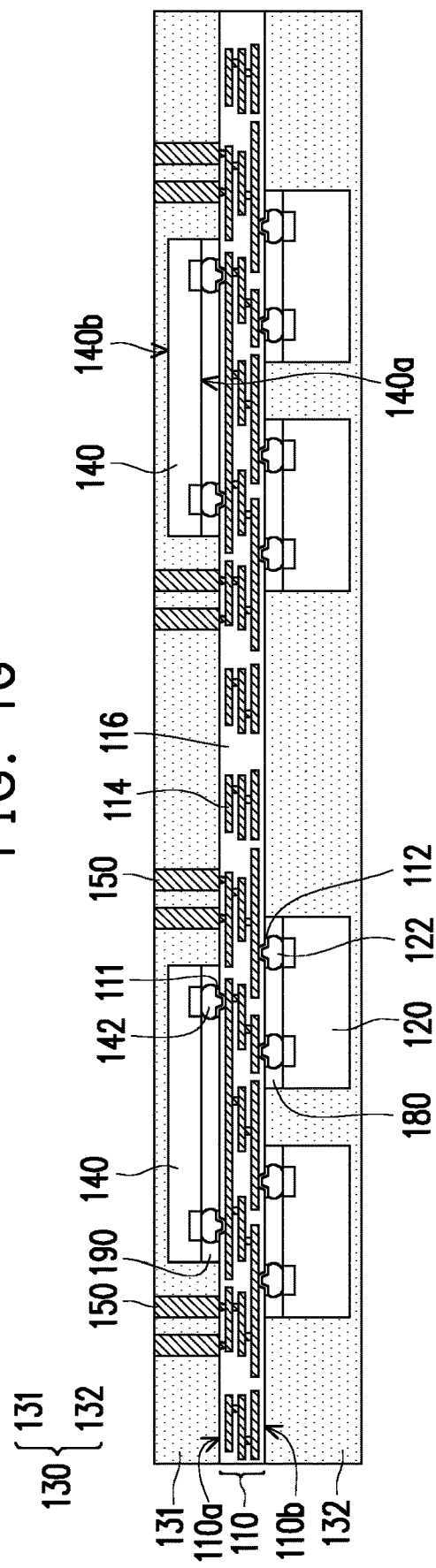

Referring to FIG. 1H, the insulating encapsulation 130 may include a first insulating portion 131 and a second insulating portion 132. The second insulating portion 132 is the above-mentioned portion of the insulating encapsulation 130 formed on the second surface 110b of the first redistribution circuit structure 110 for encapsulating the memory devices 120. The first insulating portion 131, as illustrated in FIG. 1H, may be formed on the first surface 110a of the first redistribution circuit structure 110 by an over-molding process and a grinding process, so as to encapsulate the integrated circuits 140 and the conductive pillars 150. In some embodiments, an insulating material is formed on the first surface 110a of the first redistribution circuit structure 110 to cover the integrated circuits 140 and the conductive pillars 150 entirely by the over-molding process, and the insulating material is then grinded by, for example, a mechanical grinding process and/or a chemical mechanical polishing (CMP) process until the top surfaces of the conductive pillars 150 are exposed.

Referring to FIG. 1I, a second redistribution circuit structure 160 may be formed over the integrated circuits 140, the conductive pillars 150, and the first insulating portion 131 of the insulating encapsulation 130. That is, the integrated circuits 140 are disposed between the first redistribution circuit structure 110 and the second redistribution circuit structure 160, and the integrated circuits 140 may be electrically connected to the second redistribution circuit structure 160 through the first redistribution circuit structure 110 and the conductive pillars 150 sequentially.

As shown in FIG. 1I, the second redistribution circuit structure 160 may have a plurality of conductive terminals 162 formed by an UBM layer, for example, and the conductive terminals 162 may be disposed in the recesses formed on the surface of the second redistribution circuit structure 160 for the subsequent bumping processes.

Referring to FIG. 1J, a plurality of conductive balls 170 may be correspondingly disposed on the conductive terminals 162 formed on the surface of the second redistribution circuit structure 160. For example, the conductive balls 170 may be solder balls or other metal balls.

Figure 1K:
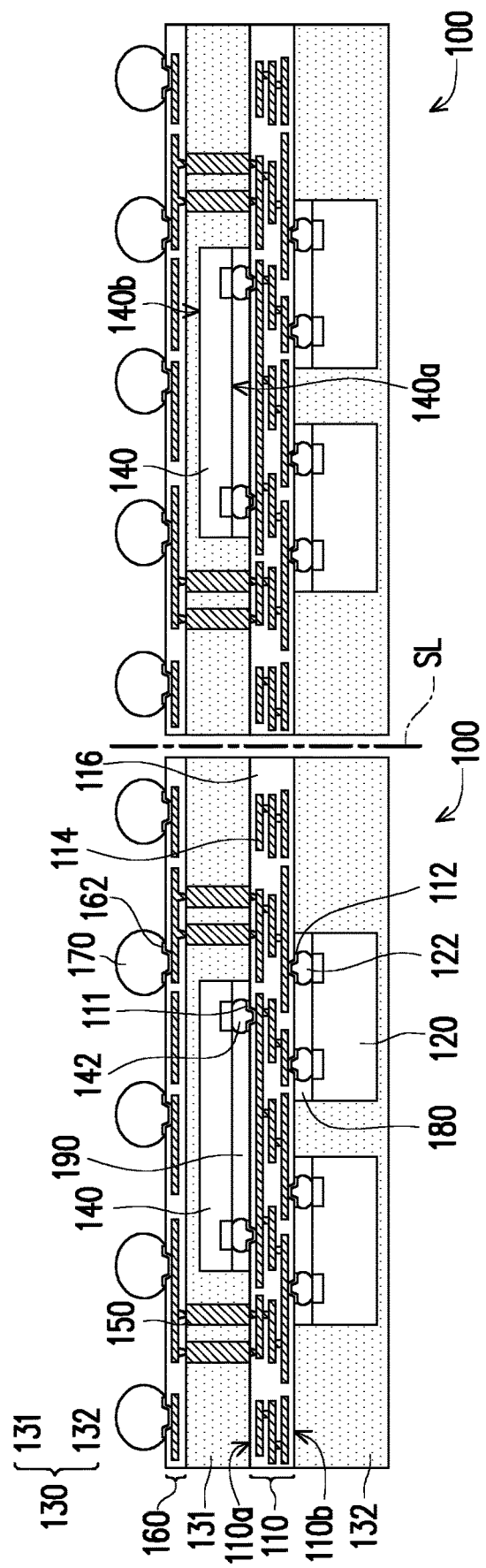

Referring to FIG. 1K, a dicing process is performed along the scribe line SL to singulate the resulted structure shown in FIG. 1J, so as to form a plurality of singulated packages 100. During the dicing process, the first redistribution circuit structure 110, the second redistribution circuit structure 160, and the insulating encapsulation 130 are sawed to form the singulated packages 100. In some embodiments, each singulated package 100 has an integrated circuit 140 and two memory devices 120 embedded therein, and the integrated circuit 140 and the memory devices 120 relatively disposed in a face to face manner. As illustrated in FIG. 1J, the lateral sides of the first redistribution circuit structure 110, between the first surface 110a and the second surface 110b of the first redistribution circuit structure 110, the lateral sides of the first insulating portion 131, and the lateral sides of the second insulating portion 132 are aligned with each other.

FIG. 2A through FIG. 2J illustrate a process flow for fabricating integrated fan-out packages in accordance with some embodiments. The embodiments illustrated in FIG. 2A through FIG. 2J are similar to embodiments illustrated in FIG. 1A to FIG. 1K. Therefore, the same reference numerals are used to refer to the same or like parts, and their detailed descriptions are omitted herein. The process flows illustrated in FIG. 2A through FIG. 2J and FIG. 1A through FIG. 1K respectively describe different sequences for forming the package 100. In detail, the difference between the process flow illustrated in FIG. 2A through FIG. 2J and the process flow illustrated in FIG. 1A through FIG. 1K is the relative sequential order of forming the memory devices 120 and the integrated circuits 140. That is, in the process flow illustrated in FIG. 1A through FIG. 1K, the memory devices 120 are firstly formed on the second surface 110b of the first redistribution circuit structure 110, and then the integrated circuits 140 are formed on the first surface 100a of the first redistribution circuit structure 110. Contrarily, in the process flow illustrated in FIG. 2A through FIG. 2J, the integrated circuits 140 are formed before the memory devices 120 being formed.

Figure 2A:
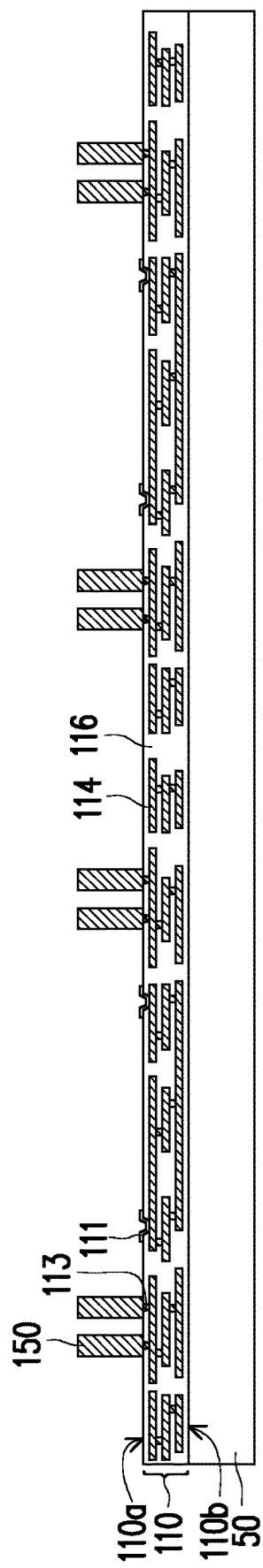
FIG. 2A through FIG. 2J illustrate a process flow for fabricating integrated fan-out packages in accordance with some alternative embodiments.

Referring to FIG. 2A, a carrier 50 is provided and a first redistribution circuit structure 110 is formed thereon. The first redistribution circuit structure 110 has the first surface 110a and the second surface 110b disposed opposite to the first surface 110a. As illustrated in FIG. 2A, the carrier 50 is adhered to the second surface 110b of the first redistribution circuit structure 110 through, for example, a de-bonding layer. A plurality of the conductive terminals 111 and the conductive pads 113 may be formed corresponding to the recesses formed on the first surface 110a of the first redistribution circuit structure 110 for the subsequent processes. As shown in FIG. 2A, the first redistribution circuit structure 110 may include the dielectric layer 116 and a plurality of the patterned trace layers 114.

Additionally, a plurality of conductive pillars 150 formed on the first surface 110a of the first redistribution circuit structure 110 through the conductive pads 113, such that the conductive pillars 150 are electrically connected to the first redistribution circuit structure 110.

Figure 2B:
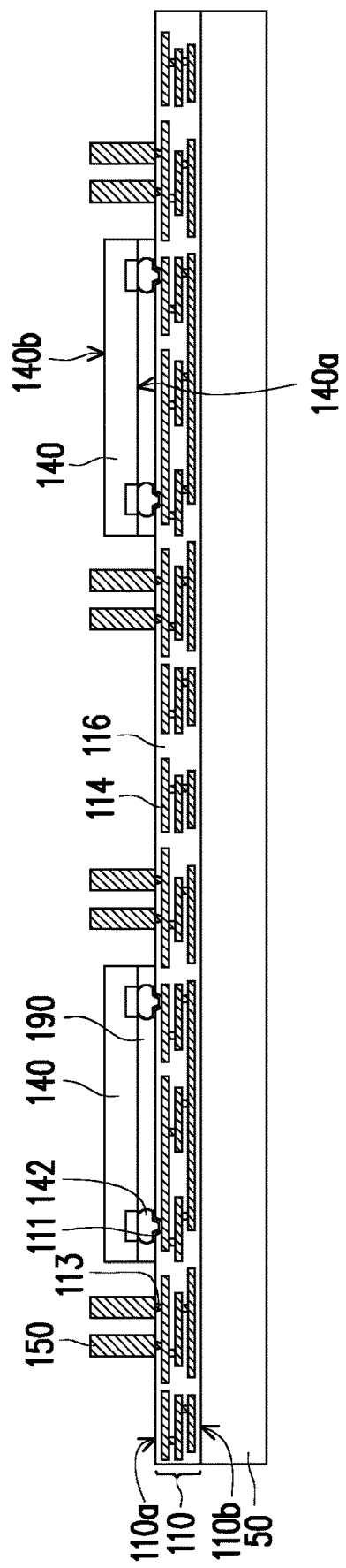

Referring to FIG. 2B, a plurality of integrated circuits 140 may be respectively mounted onto the first surface 110a of the first redistribution circuit structure 110 and disposed among the conductive pillars 150 through a plurality bumps 142 thereof and the conductive terminals 111 formed on the first surface 110a. As shown in FIG. 2B, the bumps 142 of the respective integrated circuits 140 are bonded to the conductive terminals 111 formed by an UBM layer, for example, so as to electrically connect the respective integrated circuit 140 to the first redistribution circuit structure 110. In some embodiments, the integrated circuits 140 are bonded to the first redistribution circuit structure 110 by a flip-chip bonding process. Moreover, in some embodiments, the underfill 190 is filled between the integrated circuits 140 and the first surface 110a of the first redistribution circuit structure 110 for protecting the bumps 142.

As illustrated in FIG. 2B, each integrated circuit 140 may include an active surface 140a and a rear surface 140b opposite to the active surface 140a. In some embodiments, the integrated circuit 140 may be a system on chip (SOC) integrated circuits.

Figure 2C:
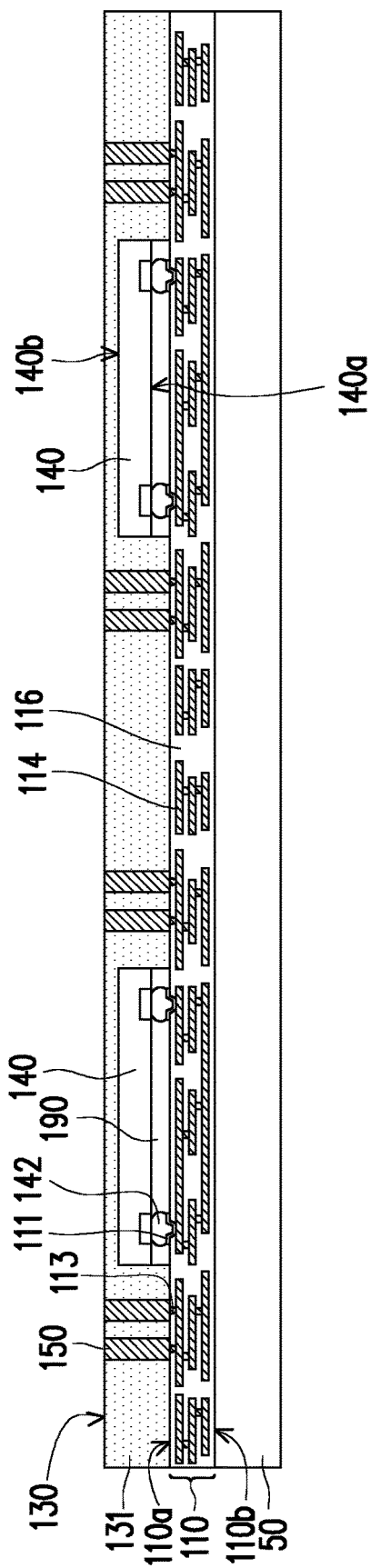

As the above-mentioned, the insulating encapsulation 130 may include the first insulating portion 131 and the second insulating portion 132. Referring to FIG. 2C, the first insulating portion 131 may be formed on the first surface 110a of the first redistribution circuit structure 110 by an over-molding process and a grinding process and encapsulates the integrated circuits 140 and the conductive pillars 150. In some embodiments, an insulating material is formed on the first surface 110a of the first redistribution circuit structure 110 to cover the integrated circuits 140 and the conductive pillars 150 entirely by the over-molding process, and the insulating material is then grinded by, for example, a mechanical grinding process and/or a chemical mechanical polishing (CMP) process until the top surface of the conductive pillars 150 are exposed. In some embodiments, the top surfaces of the conductive pillars 150 may be co-planar with the top surface of the insulating encapsulation 130.

Figure 2D:
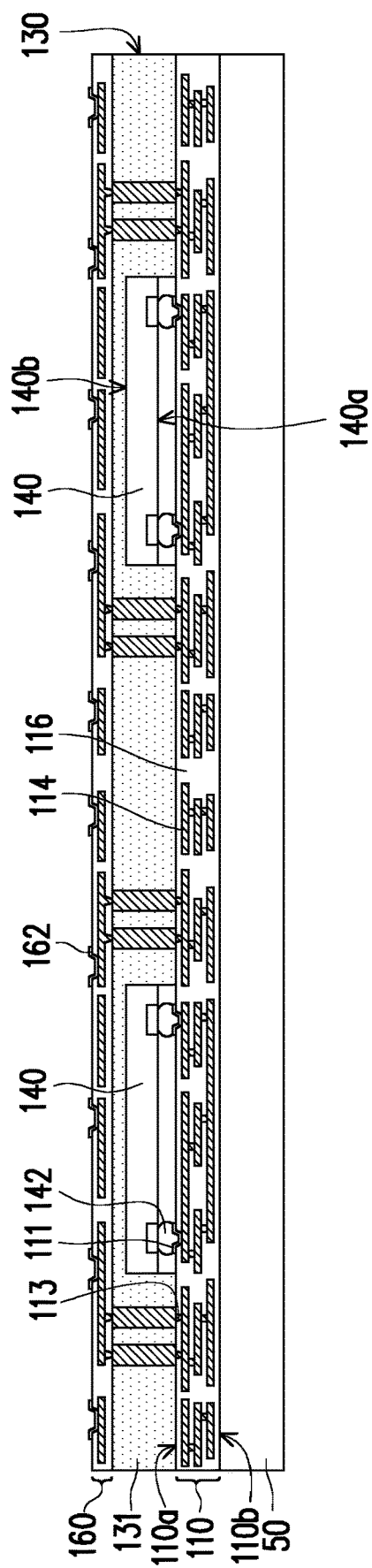

Referring to FIG. 2D, a second redistribution circuit structure 160 may be formed over the integrated circuits 140, the conductive pillars 150, and the first insulating portion 131 of the insulating encapsulation 130. That is, the integrated circuits 140 is disposed between the first redistribution circuit structure 110 and the second redistribution circuit structure 160, and the integrated circuits 140 may be electrically connected to the second redistribution circuit structure 160 through the first redistribution circuit structure 110 and the conductive pillars 150 sequentially.

As shown in FIG. 2D, the second redistribution circuit structure 160 may have a plurality of the conductive terminals 162 formed by an UBM layer, for example, and the conductive terminals 162 may be disposed in the recesses formed on the surface of the second redistribution circuit structure 160 for the subsequent bumping processes.

Figure 2E:
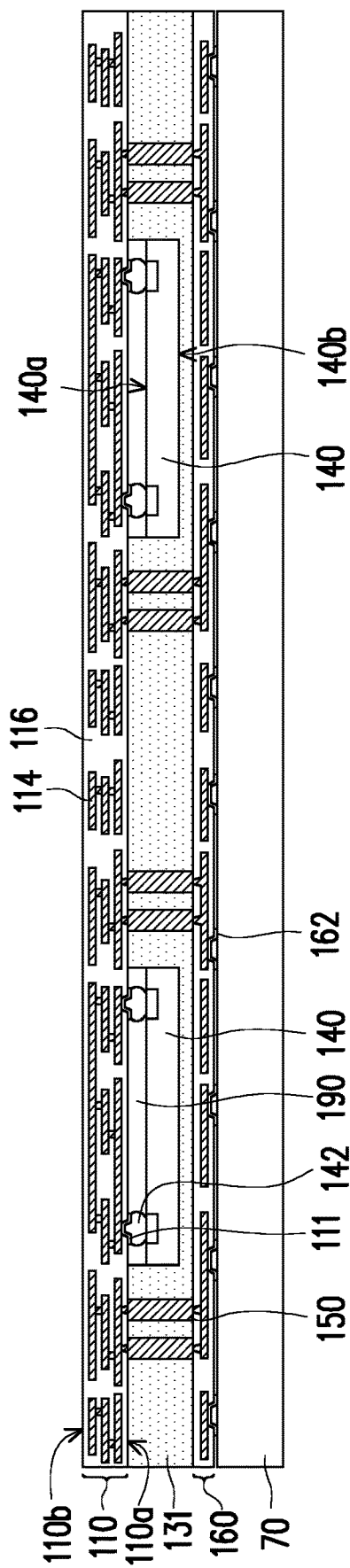

Referring to FIG. 2E, the carrier 50 and the above-mentioned de-bonding layer disposed thereon is de-bonded from the second surface 110b of the first redistribution circuit structure 110. In some embodiments, the de-bonding layer (e.g., LTHC release layer) may be irradiated by an UV laser, such that the first redistribution circuit structure 110 is separated from the de-bonding layer and the carrier 50.

In addition, as illustrated in FIG. 2E, a carrier 70 is adhered to the surface of the second redistribution circuit structure 160 and the conductive terminals 162 disposed thereon.

Figure 2F:
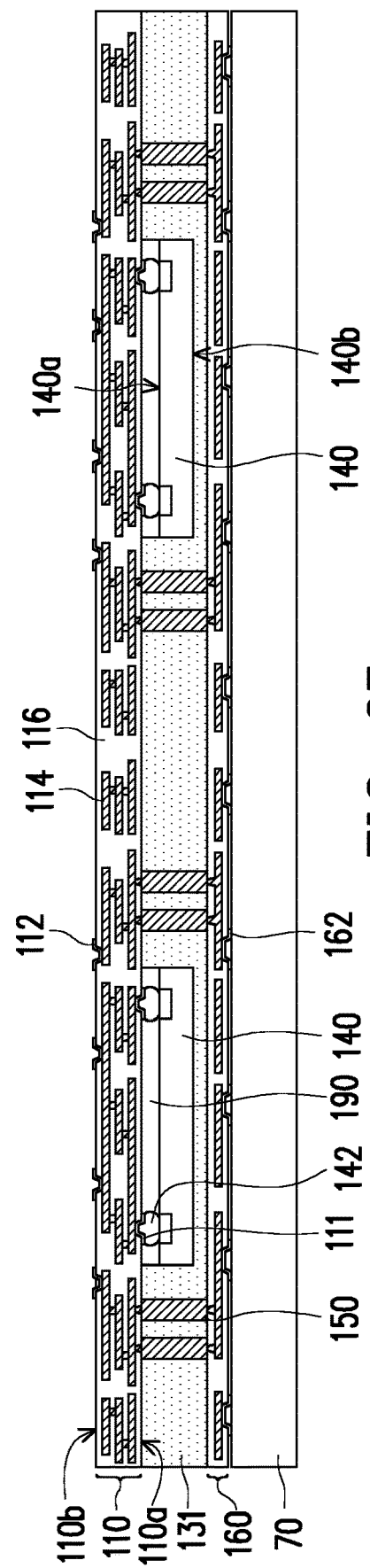

Referring to FIG. 2F, a plurality of the conductive terminals 112 is formed in the recesses on the second surface 110b of the first redistribution circuit structure 110 for the subsequent bumping processes. The recesses on the second surface 110b of the first redistribution circuit structure 110 may be formed by the laser etching process.

Figure 2G:
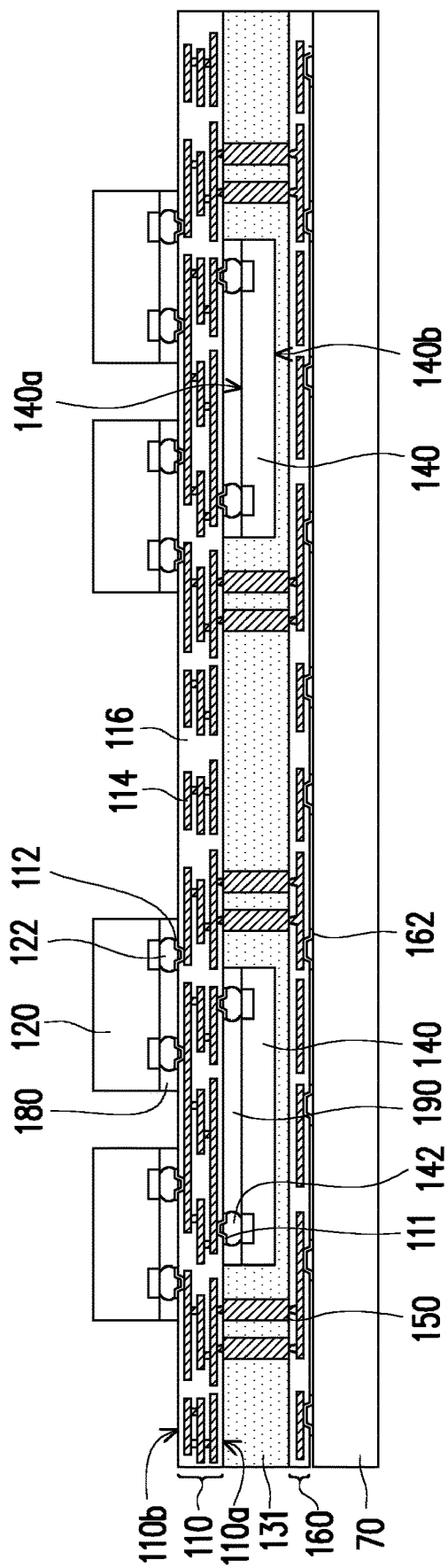

Referring to FIG. 2G, a plurality of memory devices 120 are mounted onto the second surface 110b of the first redistribution circuit structure 110 and electrically connected thereto through the conductive terminals 112 through a flip-chip bonding process and an underfill process, for example. In some embodiments, the memory devices 120 may include a plurality of bumps 122 bonded to the conductive terminals 112 on the second surface 110b of the first redistribution circuit structure 110 for electrically connecting the memory devices 120 to the first redistribution circuit structure 110. As shown in FIG. 2G, the underfill 180 may be filled between the memory devices and the second surface 110b of the first redistribution circuit structure 110 to cover and insulate the bumps 122 and the conductive terminals 112.

In some embodiments, the active surfaces of the memory devices 120 and the active surfaces of the integrated circuits 140 respectively face toward each other. That is, the memory devices 120 and the integrated circuits 140 may be relatively configured in a face to face manner. Moreover, the memory devices 120 may be electrically connected to the integrated circuits 120 directly through the first redistribution circuit structure 110. As such, the conductive paths existed between the memory devices 120 and the integrated circuits 140 are greatly shortened, so as to curtail the power consumption of the overall package 100.

Figure 2H:
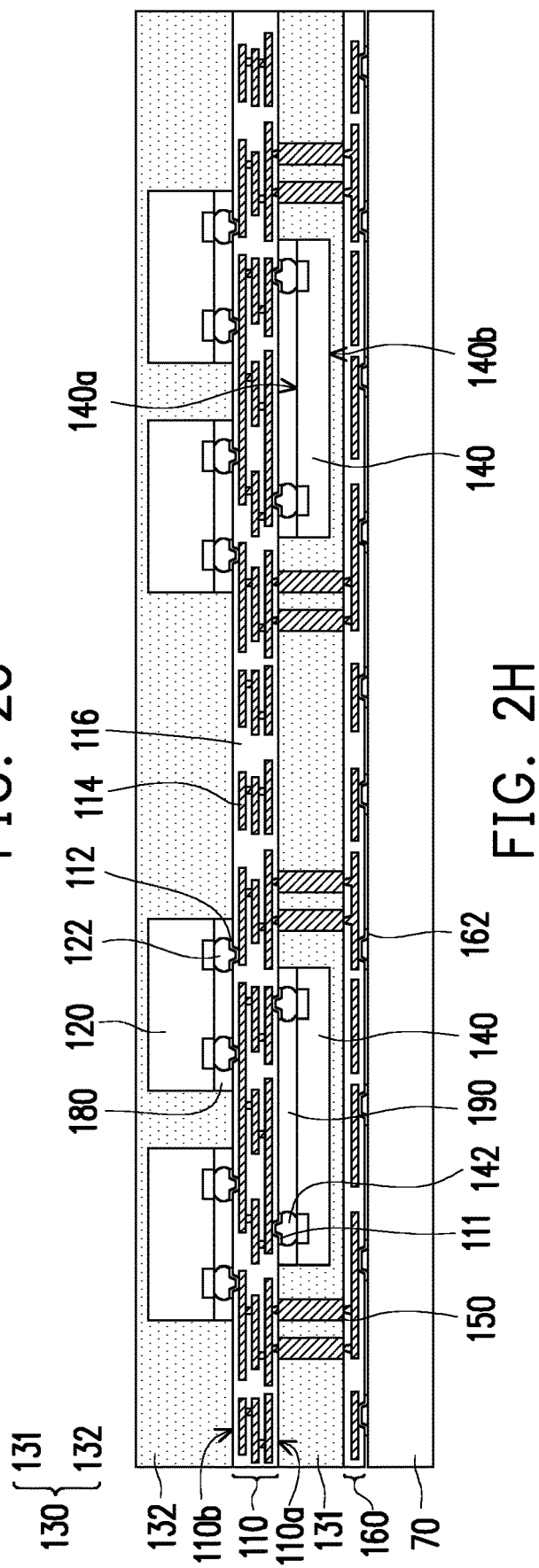

Referring to FIG. 2H, the second insulating portion 132 of the insulating encapsulation 130 is formed on the second surface 110b of the first redistribution circuit structure 110 to encapsulate the entire memory devices 120. The second insulating portion 132, as illustrated in FIG. 2H, may be formed on the second surface 110b of the first redistribution circuit structure 110 by an over-molding process and a grinding process, so as to encapsulate the memory devices 120. In some embodiments, the insulating material is formed on the second surface 110b of the first redistribution circuit structure 110 to cover the memory devices entirely by the over-molding process, and the insulating material is then grinded by, for example, a mechanical grinding process and/or a chemical mechanical polishing (CMP) process until a desired thickness of the second insulating portion 132 has been reached. In some embodiments, the insulating material may be grinded until the top surfaces of the memory devices 120 are exposed.

Figure 2I:
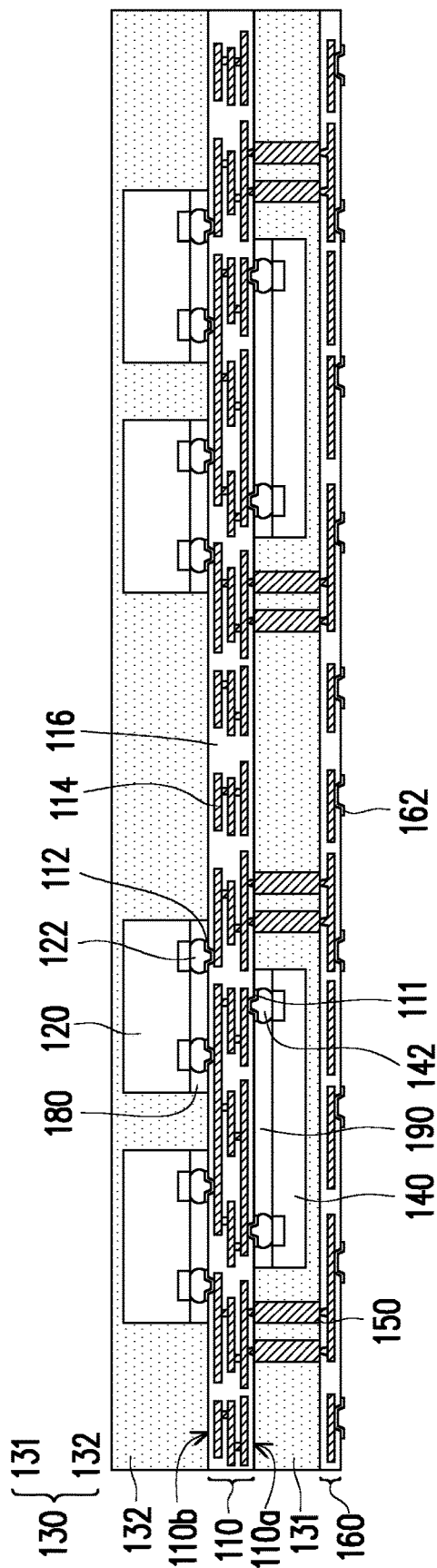

Referring to FIG. 2I, the carrier 70 is de-bonded from the surface of the second redistribution circuit structure 160, such that the conductive terminals 162 are exposed for the subsequent processes.

Figure 2J:
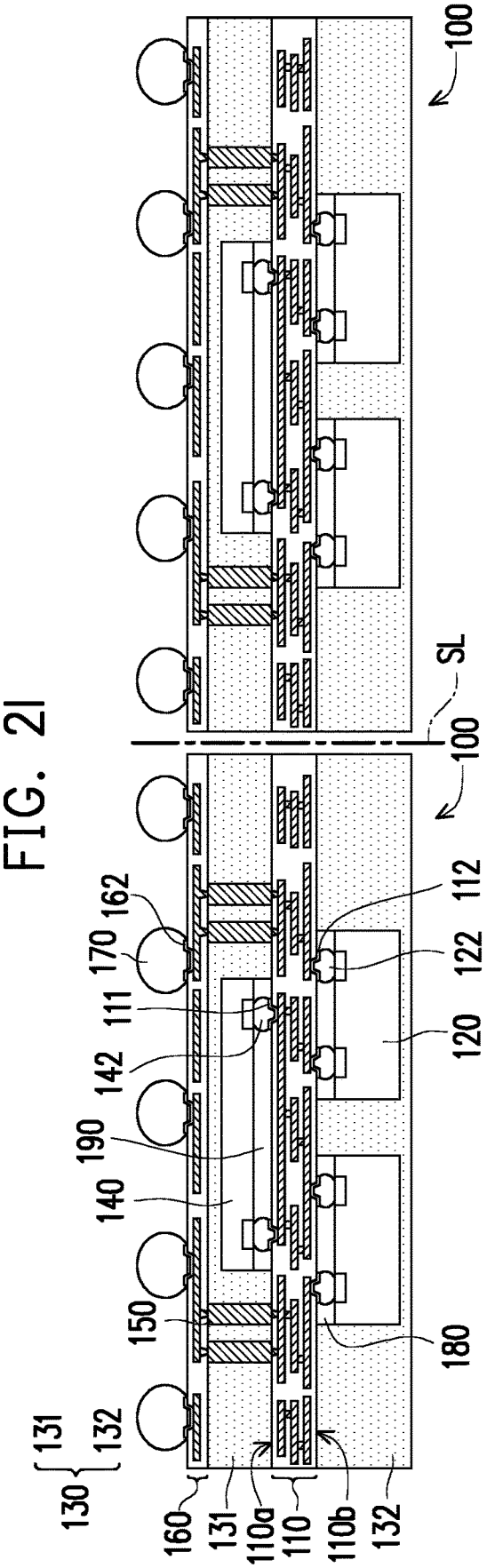

Referring to FIG. 2J, a plurality of conductive balls 170 may be correspondingly disposed on the conductive terminals 162 on the surface the second redistribution circuit structure 160 for the subsequent bumping process. For example, the conductive balls 170 may be solder balls or other metal balls.

Referring again to FIG. 2J, a dicing process is performed along the scribe line SL to singulate the resulted structure shown in FIG. 2I, so as to form a plurality of singulated packages 100. During the dicing process, the first redistribution circuit structure 110, the second redistribution circuit structure 160, and the insulating encapsulation 130 are sawed to form the singulated packages 100. In some embodiments, each singulated package 100 has an integrated circuit 140 and two memory devices 120 embedded therein, and the integrated circuit 140 and the memory devices 120 are relatively disposed in a face to face manner. However, the aforementioned configuration of the package 100 construes no limitations, the numbers of the memory devices 120 and the integrated circuits 140 embedded in the package 100 may be adjusted according to the practical needs. As illustrated in FIG. 2J, the lateral sides of the first redistribution circuit structure 110, the lateral sides of the first insulating portion 131, and the lateral sides of the second insulating portion 132 are aligned with each other.

Figure 3A:
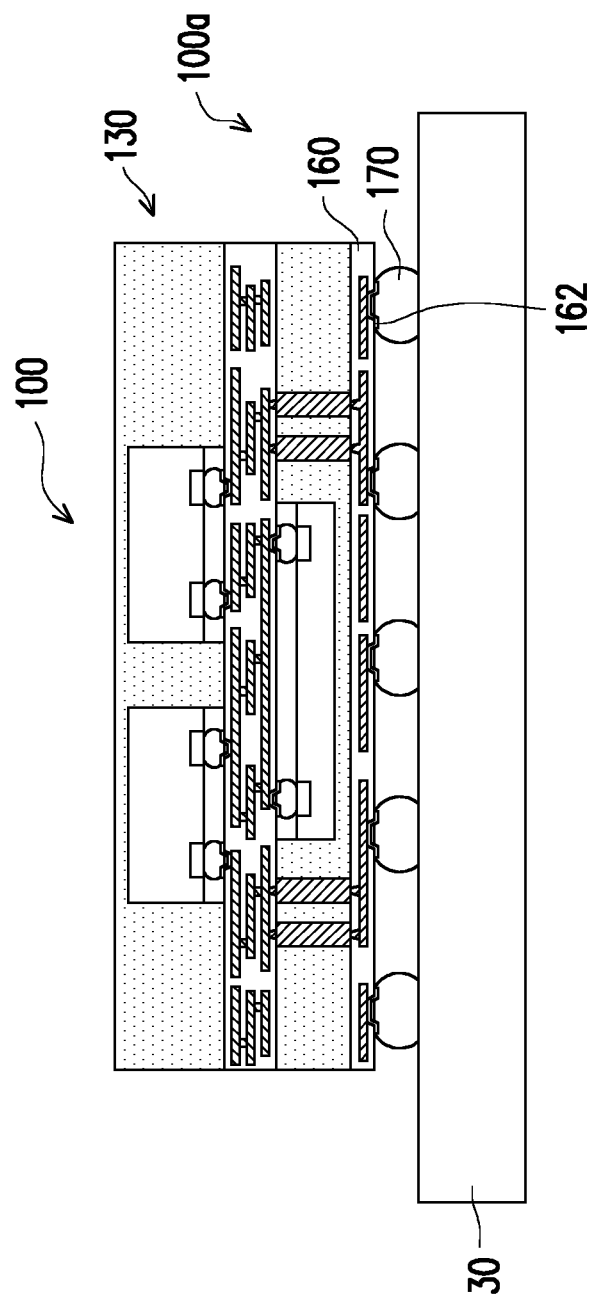
FIG. 3A through FIG. 3D illustrate an optional fabricating process flow for the integrated fan-out packages of FIG. 1K and FIG. 2J.

FIG. 3A through FIG. 3D illustrate an optional fabricating process flow for the completed integrated fan-out packages in FIG. 1K and FIG. 2J. Referring to FIG. 3A, the singulated package 100 formed in FIG. 1K and FIG. 2J may be further disposed onto a package circuit substrate 30. In detail, the singulated packages 100 formed in the above-mentioned fabricating processes may be picked-up and mounted onto the package circuit substrate 30. The singulated package 100 is electrically connected to the package circuit substrate 30 through the conductive balls 170 and the conductive terminals 162. As illustrated in FIG. 3A, the integrated circuit 140 and the memory devices 120 are disposed over the package circuit substrate 30 in a stacking manner. Accordingly, the utilized area size of the package circuit substrate 30 can be further reduced due to a smaller occupying area of the package 100 over the package circuit substrate 30. As such, the material cost of the package circuit substrate 30 may be also reduced.

Figure 3B:
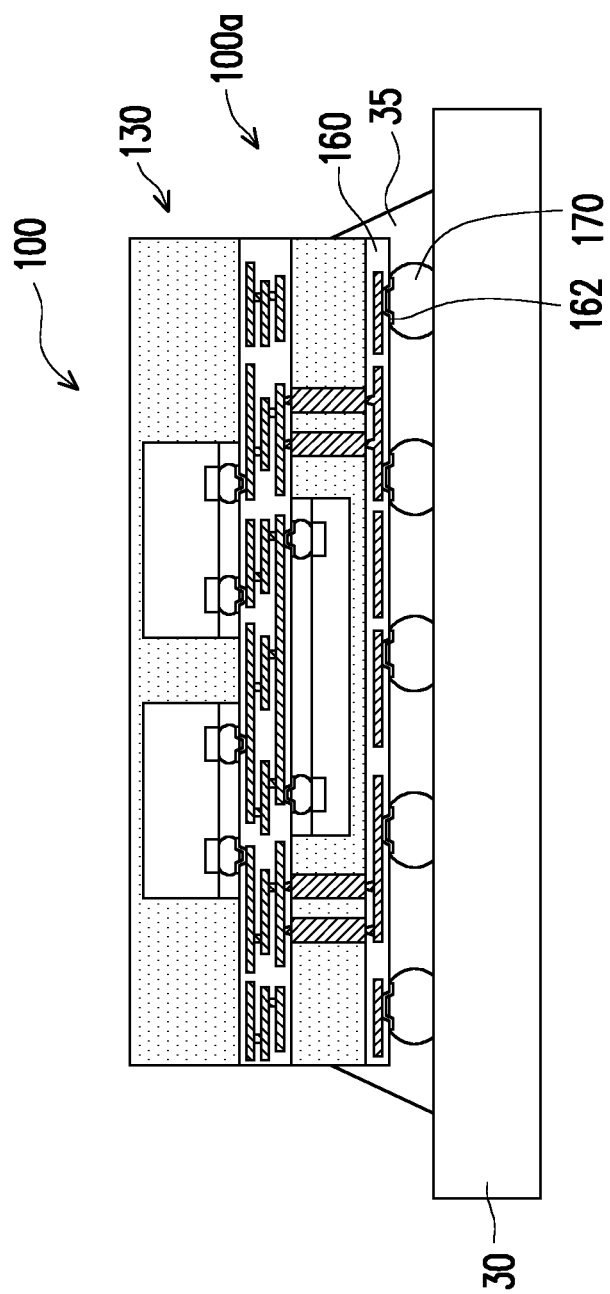

Referring to FIG. 3B, in order to enhance the bonding reliability of the conductive terminals 162 and the conductive balls 170 disposed thereon, an underfill 35 may be filled between the second redistribution circuit structure 160 and the package circuit substrate 30. The underfill 35 encapsulates the conductive terminals 162 and the conductive balls 170 to secure the structural integrity of the conductive balls, the conductive terminals 160 and its bonding interfaces at the second redistribution circuit structure 160 due to the coefficient of thermal expansion (CTE) mismatch between second redistribution circuit structure 160 and the package circuit substrate 30. In other words, the shearing stress resulted from CTE mismatch may be absorbed by the underfill 35, and the conductive terminals 162 and the conductive balls can be protected by the underfill 35.

Figure 3C:
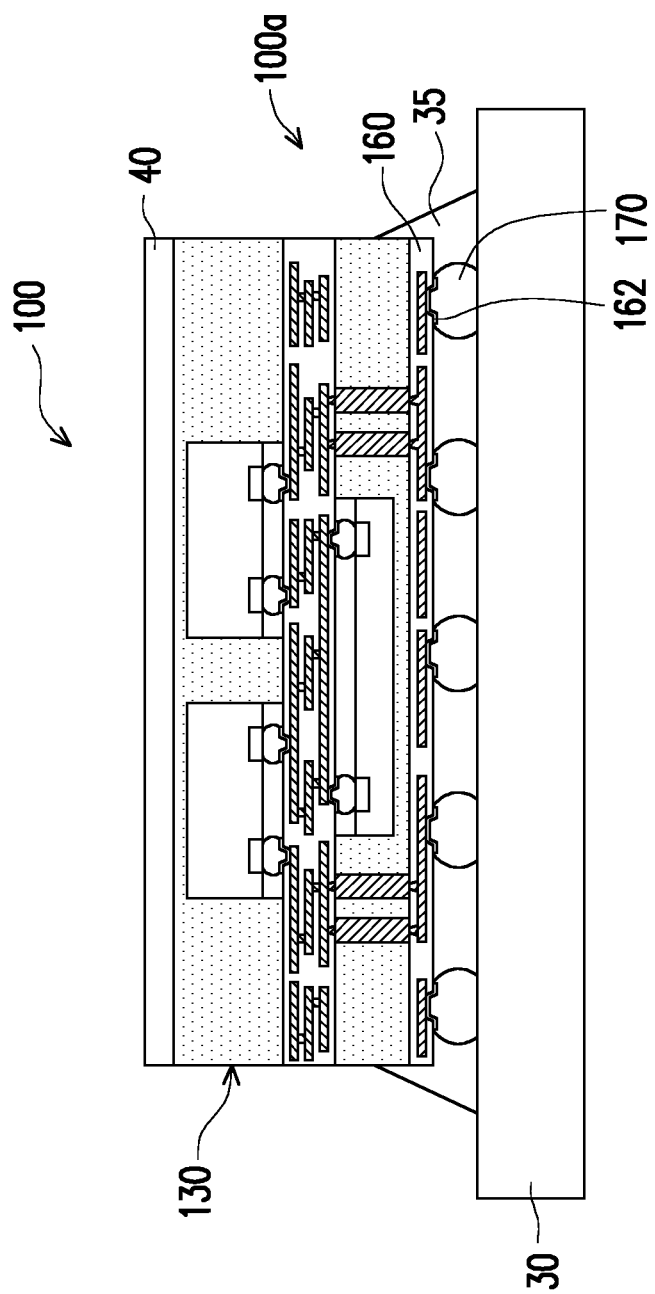

Referring to FIG. 3C, a heat spreader 40 may be disposed to further enhance the thermal dissipation capability, and the heart spreader may be adhered on the top surface of the insulating encapsulation 130. For example, the material of the heat spreader 40 may include aluminum or other suitable metallic materials. In addition, a thermal interface material (TIM) (not illustrated) may be disposed between the heat spreader 40 and the insulating encapsulation 130.

Figure 3D:
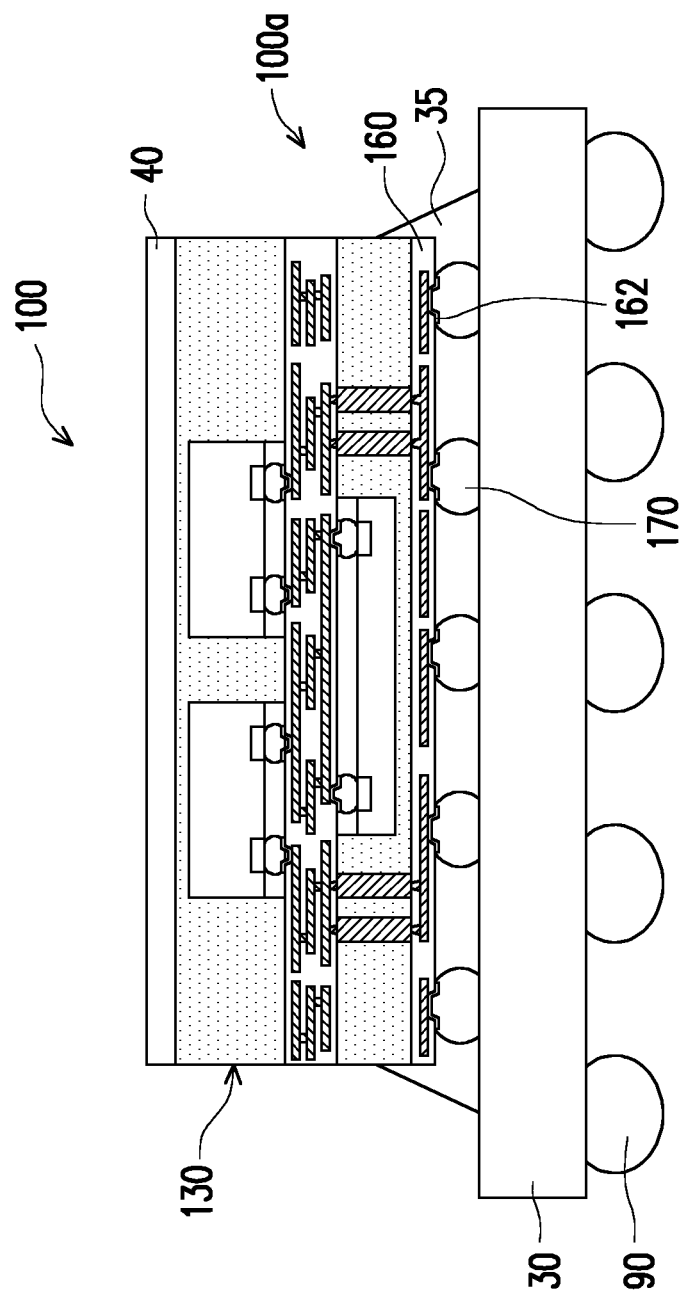

Referring to FIG. 3D, the package circuit substrate 30 may further include a plurality of conductive balls 90 distributed on the bottom surface thereof. For example, the conductive balls 90 may be solder balls or other metal balls. It is noted that the arranging pitch between the conductive balls 170 is less than the arranging pitch between the conductive balls 90, for example. In other words, the package circuit substrate 30 having the conductive balls 90 distributed thereon may be a ball-grid array (BGA) circuit board, and a ball-grid array (BGA) package 100a including the singulated packages 100 and the package circuit substrate 30 is accomplished. It should be noted that the package 100 along is suitable for mobile application, and the BGA package 100a, including the package 100, substrate 30 and conductive balls 90, can be applied for high performance application.

FIG. 4A through FIG. 4K illustrate a process flow for fabricating integrated fan-out packages in accordance with some embodiments. The embodiments illustrated in FIG. 4A through FIG. 4K are similar to embodiments illustrated in FIG. 1A to FIG. 1K. Therefore, the same reference numerals are used to refer to the same or like parts, and their detailed descriptions are omitted herein. The obvious difference between the current embodiments and the previously embodiments is the configurations of the integrated circuits 140 relative to the memory devices 120.

Figure 4A:
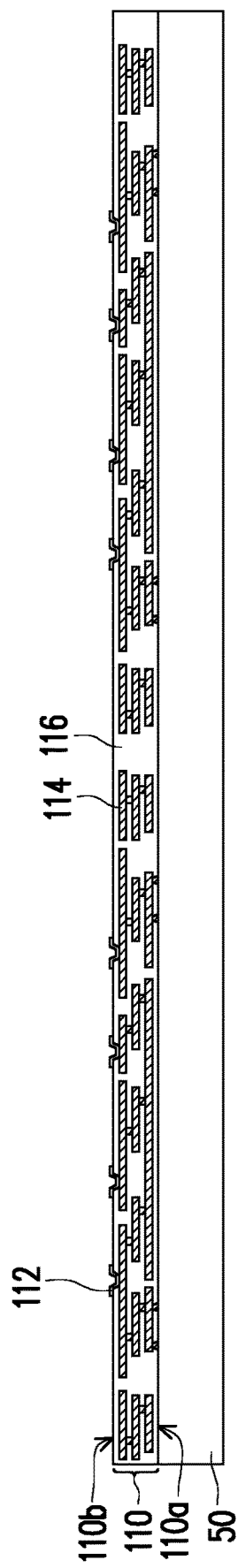

Referring to FIG. 4A, the carrier 50 is provided and the first redistribution circuit structure 110 is formed thereon. The first redistribution circuit structure 110 has a first surface 110a and a second surface 110b disposed opposite to the first surface 110a. A plurality of conductive terminals 112 may be formed corresponding to the recesses on the second surface 110b of the first redistribution circuit structure 110 for the subsequent processes. As shown in FIG. 4A, the first redistribution circuit structure 110 may include the dielectric layer 116 and a plurality of the patterned trace layers 114.

In some embodiments, the carrier 50 includes a de-bonding layer (not illustrated) formed thereon and adhered to the first surface 110a of the first redistribution circuit structure 110. The carrier 50 may be a glass substrate, and the de-bonding layer may be a light-to-heat conversion (LTHC) release layer formed on the glass substrate. The material of the carrier 50 and the above-mentioned de-bonding layer are not limited in this disclosure.

Figure 4B:
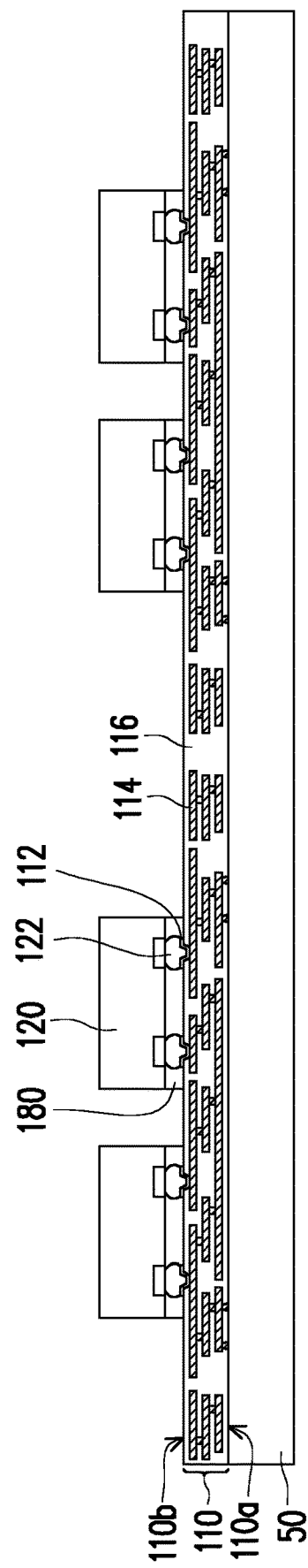

Referring to FIG. 4B, a plurality of the memory devices 120 are mounted onto the second surface 110b of the first redistribution circuit structure 110 and electrically connected thereto through the conductive terminals 112 by the flip-chip bonding process and the underfill process, for example. In some embodiments, the memory devices 120 may include a plurality of bumps 122 bonded to the conductive terminals 112 for electrically connecting the memory devices 120 to the first redistribution circuit structure 110. As shown in FIG. 4B, the underfill 180 may be filled between the memory devices 120 and the first surface 110b of the first redistribution circuit structure 110 to cover and to insulate the bumps 122 and the conductive terminals 112.

Referring to 4C, an insulating encapsulation 130 may be formed by an over-molding process and a grinding process over the second surface 110b of the first redistribution circuit structure 110. In some embodiments, the material of the insulating encapsulation 130 may be the molding compound formed by the molding process. The material of the insulating encapsulation 130 may include epoxy or other suitable materials.

Figure 4C:
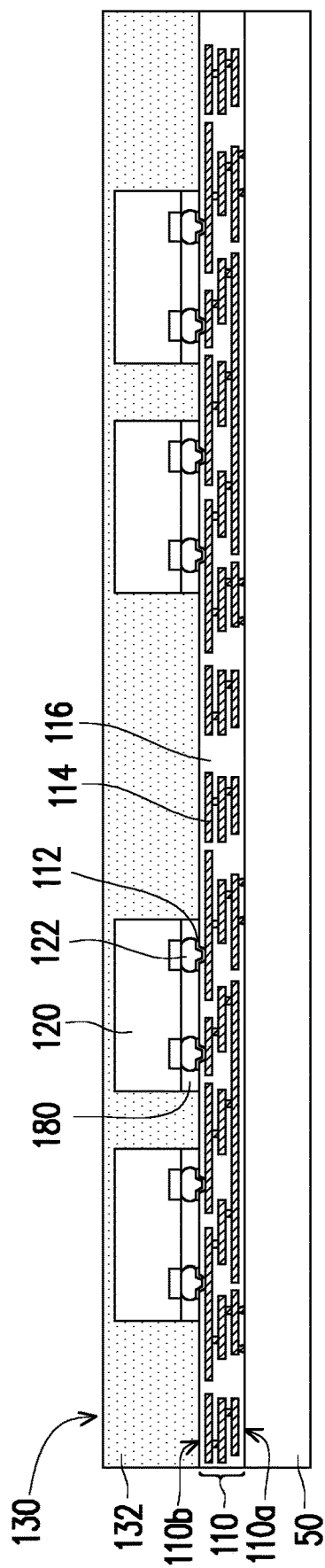

As shown in FIG. 4C, the insulating material is formed to entirely encapsulate the memory devices 120 by the over-molding process, and the insulating material is subsequently grinded by a mechanical grinding process and/or a chemical mechanical polishing (CMP) process until the insulating encapsulation 130 having the desired thickness. In some embodiments, the insulating material may be continuously grinded until the top surfaces of the memory devices 120 are exposed. In some alternative embodiments, the top surface of the insulating encapsulation 130 may be co-planar with the top surfaces of the memory devices 120.

Figure 4D:
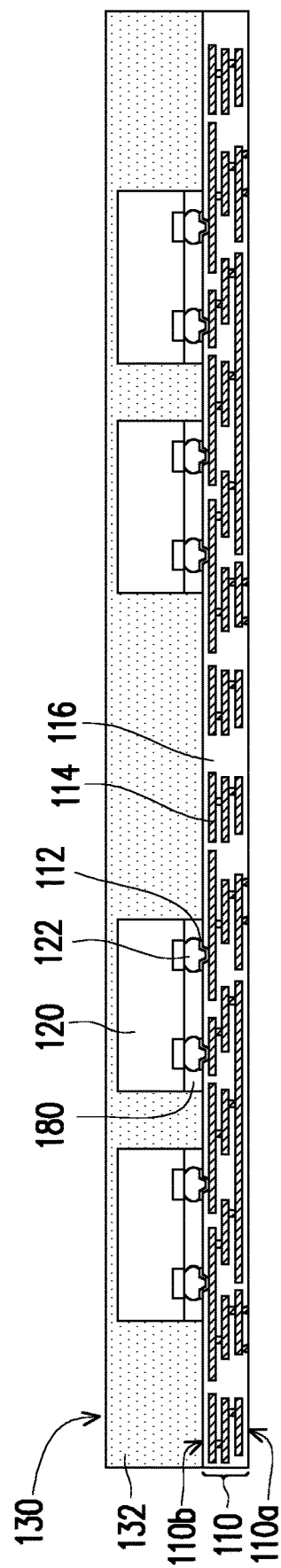

Referring to FIG. 4D, the carrier 50 and the above-mentioned de-bonding layer disposed thereon is de-bonded from the first surface 110a of the first redistribution circuit structure 110. In some embodiments, the de-bonding layer (e.g., LTHC release layer) may be irradiated by ab UV laser, such that the first redistribution circuit structure 110 is separated from the de-bonding layer and the carrier 50.

Figure 4E:
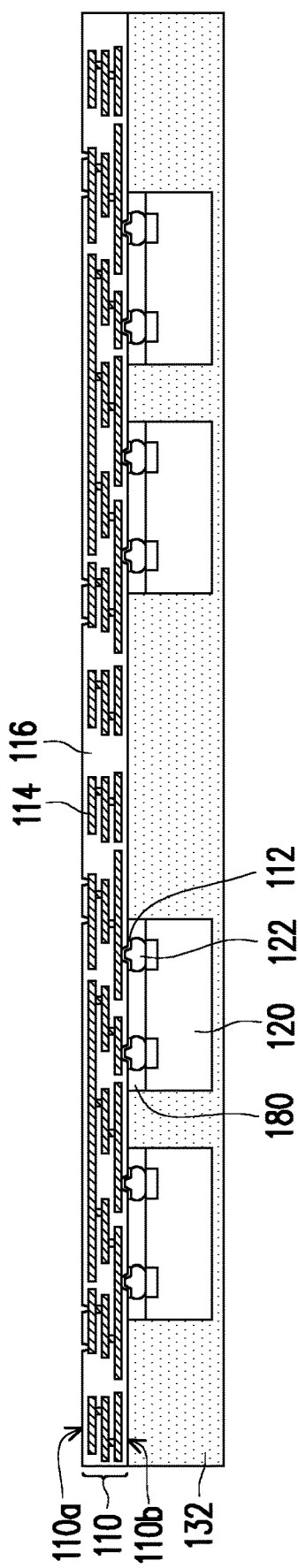

Referring to FIG. 4E, a plurality of the recesses may be formed on the first surface 110a of the first redistribution circuit structure 110 by the laser etching process or the lithography process, for example, and the recesses may be exposed by the dielectric layer 116 for the subsequent processes.

Figure 4F:
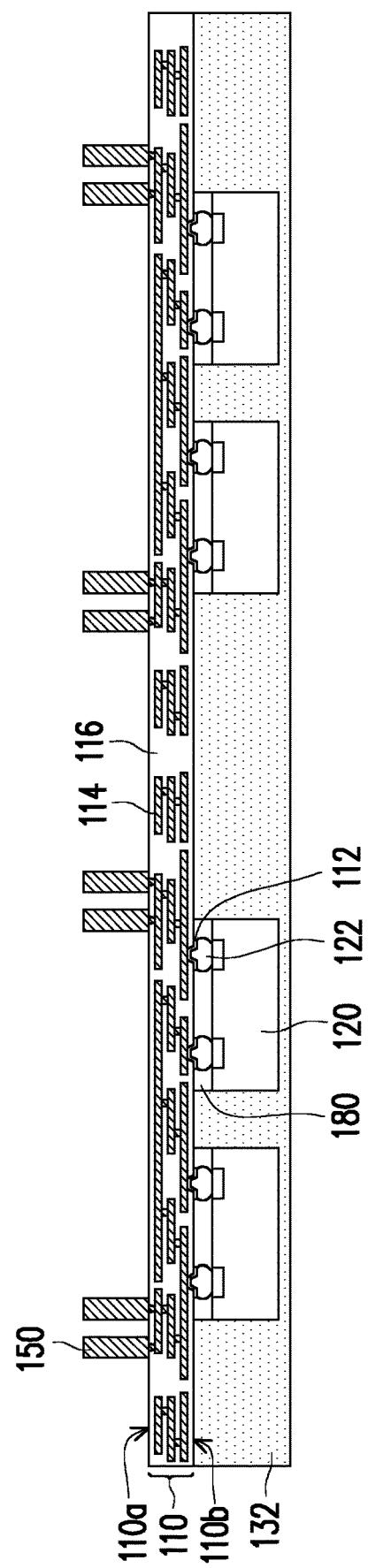

Referring to FIG. 4F, a plurality of the conductive terminals 111, formed by the under-bump metallurgy (UBM) layer, for example, and a plurality the conductive pads 113 may are formed on the first surface 110a of the first redistribution circuit structure 110. Moreover, as illustrated in FIG. 4F, a plurality of conductive pillars 150 are formed on the first surface 110a of the first redistribution circuit structure 110 and electrically connected thereto respectively through the conductive pads 113.

Referring to FIG. 4G, a plurality of the integrated circuits 140 may be respectively mounted onto the first surface 110a of the first redistribution circuit structure 110 and disposed among the conductive pillars 150 through the die-attach film (DAF) 146 used in the die-bond process. In some embodiments, the integrated circuit 140 may be a system on chip (SOC) integrated circuits. Each integrated circuit 140 may include an active surface 140a and a rear surface 140b opposite to the active surface 140a. The die-attach film 146 is disposed between the rear surface 140b of the integrated circuit 140 and the first surface 110a of the first redistribution circuit structure 110. That is, the rear surface 140b of the integrated circuit 140 faces the first redistribution circuit structure 110 and the memory devices 120. As such, in the present embodiments, the memory devices 120 and the integrated circuit 140 may be disposed in a face to back manner.

As shown in FIG. 4G, a passivation layer 190 is disposed on the active surface 140a of the integrated circuit 140 for protection. The integrated circuit 140 may have a plurality of conductive pads 145 disposed in the active surface 140a. In addition, the passivation layer 190 may have a plurality of contact openings, and the conductive pads 145 are exposed by the contact openings. Furthermore, a plurality of conductive terminals 144 may be disposed on the conductive pads 145 for the subsequent processes. In some embodiments, the passivation layer 190 may be a polyimide (PI) layer, a polybenzoxazole (PBO) layer, or other suitable dielectric materials.

Referring to FIG. 4H, the insulating encapsulation 130 may include a first insulating portion 131 and the second insulating portion 132. The second insulating portion 132 is the above-mentioned portion of the insulating encapsulation 130, which is formed on the second surface 110b of the first redistribution circuit structure 110 and encapsulates the memory devices 120. The first insulating portion 131, as illustrated in FIG. 4H, may be formed on the first surface 110a of the first redistribution circuit structure 110 by an over-molding process and a grinding process, so as to encapsulate the integrated circuits 140 and the conductive pillars 150. In some embodiments, the insulating material is formed on the first surface 110a of the first redistribution circuit structure 110 to cover the integrated circuits 140 and the conductive pillars 150 entirely by the over-molding process, and the insulating material is then grinded by, for example, a mechanical grinding process and/or a chemical mechanical polishing (CMP) process until the top surface of the conductive pillars 150 are exposed. In some embodiments, the top surface of the passivation layer 190 may be also exposed after the grinding process, and the top surface of the passivation layer 190, the top surface of the conductive pillars 150, and the top surface of the first insulating portion 131 may be co-planar with each other.

Referring to FIG. 4I, a second redistribution circuit structure 260 may be formed over the integrated circuits 140, the conductive pillars 150, and the first insulating portion 131 of the insulating encapsulation 130. That is, the integrated circuits 140 is disposed between the first redistribution circuit structure 110 and the second redistribution circuit structure 260, and the integrated circuits 140 may be electrically connected to the second redistribution circuit structure 260 through the conductive pads 145 and the conductive terminals 144, and the passivation layer 190 disposed between the active surface 140a of the integrated circuit 140 and the second redistribution circuit structure 260. The second redistribution circuit structure 260 may include a dielectric layer 266 and a plurality of patterned trace layers 264. As illustrated in FIG. 4I, the integrated circuit 140 is electrically connected to the memory devices 120 sequentially through the second redistribution circuit structure 260, the conductive pillars 150, and the first redistribution circuit structure 110.

As shown in FIG. 4I, the second redistribution circuit structure 260 may have a plurality of conductive terminals 262 formed by an UBM layer, for example, and the conductive terminals 262 may be disposed in the recesses formed on the surface of the second redistribution circuit structure 260 by the laser etching process or the lithography process, for example, for the subsequent bumping processes.

Referring to FIG. 4J, a plurality of conductive balls 170 may be correspondingly disposed on the conductive terminals 262 formed on the surface the second redistribution circuit structure 260. For example, the conductive balls 170 may be solder balls or other metal balls.

Figure 4K:
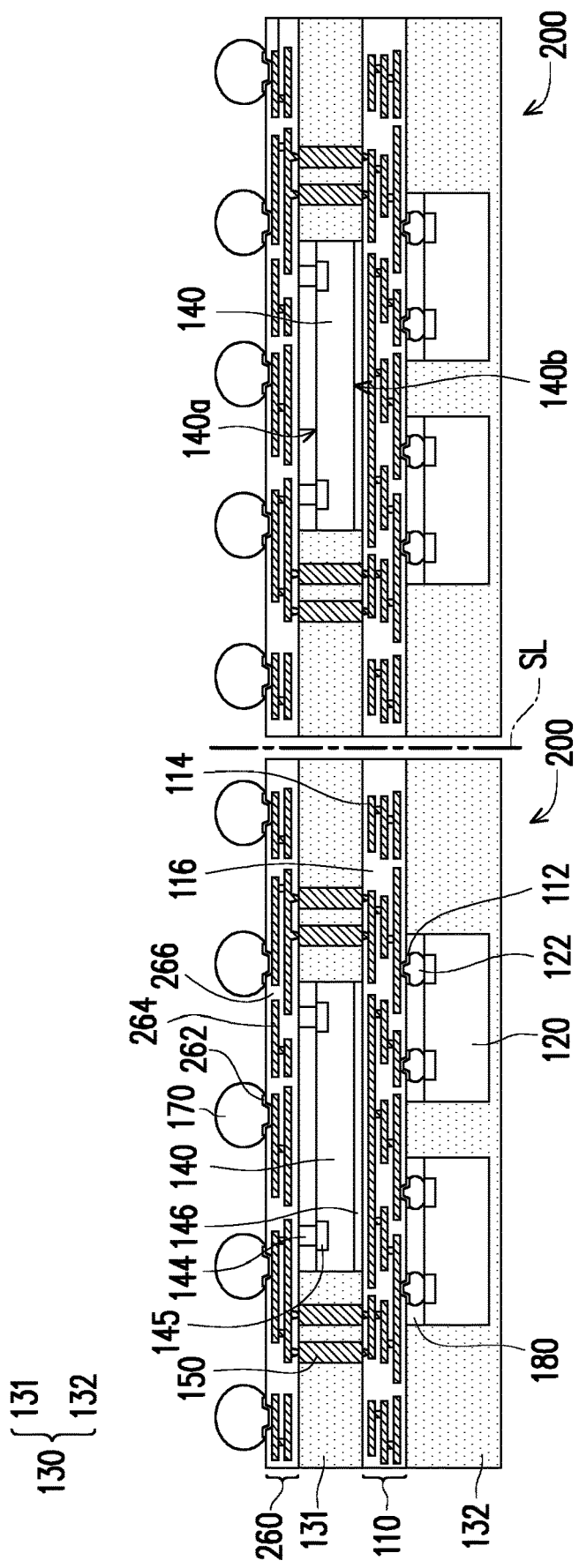

Referring to FIG. 4K, a dicing process is performed along the scribe line SL to singulate the resulted structure shown in FIG. 4J, so as to form a plurality of singulated packages 200. During the dicing process, the first redistribution circuit structure 110, the second redistribution circuit structure 260, and the insulating encapsulation 130 are sawed to form the singulated packages 200. In some embodiments, each singulated package 200 has an integrated circuit 140 and two memory devices 120 respectively disposed at opposite sides of the first redistribution circuit structure 110, and memory devices 120 and the integrated circuit 140 are relatively disposed in a face to back manner. As illustrated in FIG. 4J, the lateral sides of the first redistribution circuit structure 110, the lateral sides of the first insulating portion 131, and the lateral sides of the second insulating portion 132 are aligned with each other.

FIG. 5A through FIG. 5J illustrate a process flow for fabricating integrated fan-out packages in accordance with some embodiments. The embodiments illustrated in FIG. 5A through FIG. 5J are similar to embodiments illustrated in FIG. 4A to FIG. 4K. Therefore, the same reference numerals are used to refer to the same or like parts, and their detailed descriptions are omitted herein. The process flows illustrated in FIG. 5A through FIG. 5J and FIG. 4A through FIG. 4K respectively describe different sequences for forming the package 200. In detail, the difference between the process flow illustrated in FIG. 5A through FIG. 5J and the process flow illustrated in FIG. 4A through FIG. 4K is the sequential order of forming the memory devices 120 and the integrated circuits 140. That is, in the process flow illustrated in FIG. 4A through FIG. 4K, the memory devices 120 are formed firstly on the second surface 110b of the first redistribution circuit structure 110, and then the integrated circuits 140 are formed on the first surface 100a of the first redistribution circuit structure 110. Contrarily, in the process flow illustrated in FIG. 5A through FIG. 5J, the integrated circuits 140 are formed firstly before the memory devices 120 being formed.

Referring to FIG. 5A, a carrier 50 is provided and a first redistribution circuit structure 110 is formed thereon. The first redistribution circuit structure 110 has the first surface 110a and the second surface 110b disposed opposite to the first surface 110a. As illustrated in FIG. 5A, the carrier 50 is adhered to the second surface 110b of the first redistribution circuit structure 110 through, for example, a de-bonding layer. A plurality of the conductive pads 113 may be formed correspondingly to the recesses formed on the first surface 110a of the first redistribution circuit structure 110 for the subsequent processes. As shown in FIG. 5A, the first redistribution circuit structure 110 may include the dielectric layer 116 and a plurality of the patterned trace layers 114.

Additionally, a plurality of conductive pillars 150 formed on the first surface 110a of the first redistribution circuit structure 110 through the conductive pads 113, such that the conductive pillars 150 are electrically connected to the first redistribution circuit structure 110.

Referring to FIG. 5B, a plurality of the integrated circuits 140 may be respectively mounted onto the first surface 110a of the first redistribution circuit structure 110 and disposed among the conductive pillars 150 through a die-attach film (DAF) 146 used in the die-bond process. In some embodiments, the integrated circuit 140 may be a system on chip (SOC) integrated circuits. Each integrated circuit 140 may include an active surface 140a and a rear surface 140b opposite to the active surface 140a. The die-attach film 146 is disposed between the rear surface 140b of the integrated circuit 140 and the first surface 110a of the first redistribution circuit structure 110.

As shown in FIG. 5B, a passivation layer 190 is disposed on the active surface 140a of the integrated circuit 140 for protection. The integrated circuit 140 may have a plurality of the conductive pads 145 disposed in the active surface 140a. In addition, the passivation layer 190 may have a plurality of contact openings, and the conductive pads 145 are exposed by the contact openings. In addition, a plurality of conductive terminals 144 may be disposed on the conductive pads 145 for the subsequent processes. In some embodiments, the passivation layer may be a polyimide (PI) layer, a polybenzoxazole (PBO) layer, or other suitable dielectric materials.

As the above-mentioned, the insulating encapsulation 130 may include the first insulating portion 131 and the second insulating portion 132. Referring to FIG. 5C, the first insulating portion 131 may be formed on the first surface 110a of the first redistribution circuit structure 110 by an over-molding process and a grinding process and encapsulates the integrated circuits 140 and the conductive pillars 150. In some embodiments, an insulating material is formed on the first surface 110a of the first redistribution circuit structure 110 to cover the integrated circuits 140 and the conductive pillars 150 entirely by the over-molding process, and the insulating material is then grinded by, for example, a mechanical grinding process and/or a chemical mechanical polishing (CMP) process until the top surface of the conductive pillars 150 are exposed. In some embodiments, the top surface of the passivation layer 190 is also exposed by the insulating encapsulation 130 and may be co-planar with the top surface of the conductive pillars 150 and the top surface of the insulating encapsulation 130.

Referring to FIG. 5D, a second redistribution circuit structure 260 may be formed over the integrated circuits 140, the conductive pillars 150, and the first insulating portion 131 of the insulating encapsulation 130. That is, the integrated circuits 140 is disposed between the first redistribution circuit structure 110 and the second redistribution circuit structure 260, and the integrated circuits 140 may be electrically connected to the second redistribution circuit structure 260 through the conductive pads 145 and the conductive terminals 144, and the passivation layer 190 disposed between the active surface 140a of the integrated circuit 140 and the second redistribution circuit structure 260. The second redistribution circuit structure 260 may include a dielectric layer 266 and a plurality of patterned trace layers 264.

As shown in FIG. 5D, the second redistribution circuit structure 260 may have a plurality of conductive terminals 262 formed by an UBM layer, for example, and the conductive terminals 262 may be disposed in the recesses formed on the surface of the second redistribution circuit structure 260 by the laser etching process, for example, for the subsequent bumping processes.

Figure 5E:
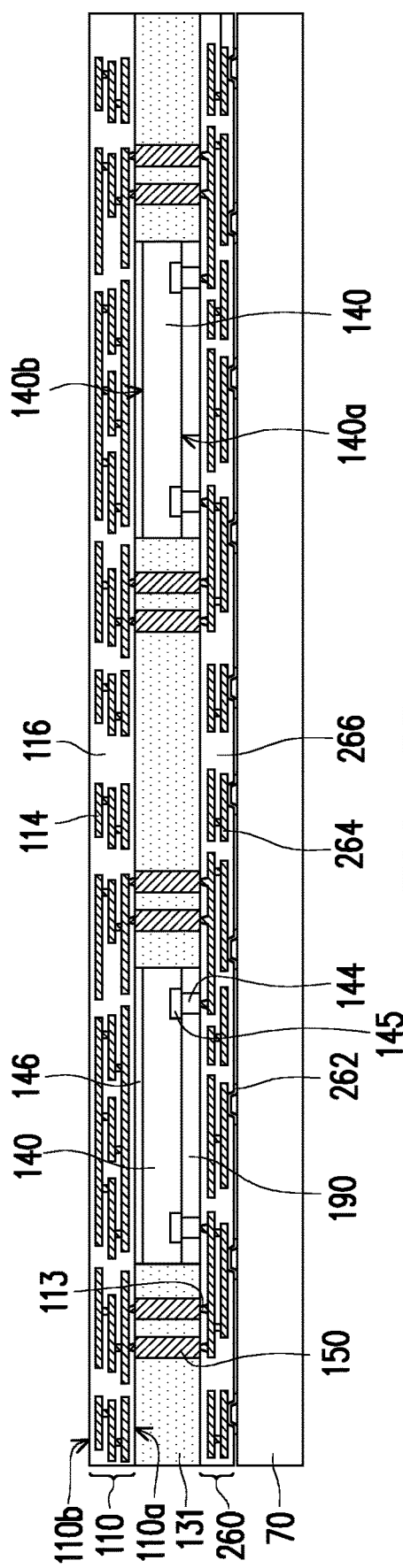

Referring to FIG. 5E, the carrier 50 and the above-mentioned de-bonding layer disposed thereon is de-bonded from the second surface 110b of the first redistribution circuit structure 110. In some embodiments, the de-bonding layer (e.g., LTHC release layer) may be irradiated by an UV laser, such that the first redistribution circuit structure 110 is separated from the de-bonding layer and the carrier 50.

In addition, as illustrated in FIG. 5E, a carrier 70 is adhered to the surface of the second redistribution circuit structure 260 and the conductive terminals 262 disposed thereon.

Figure 5F:
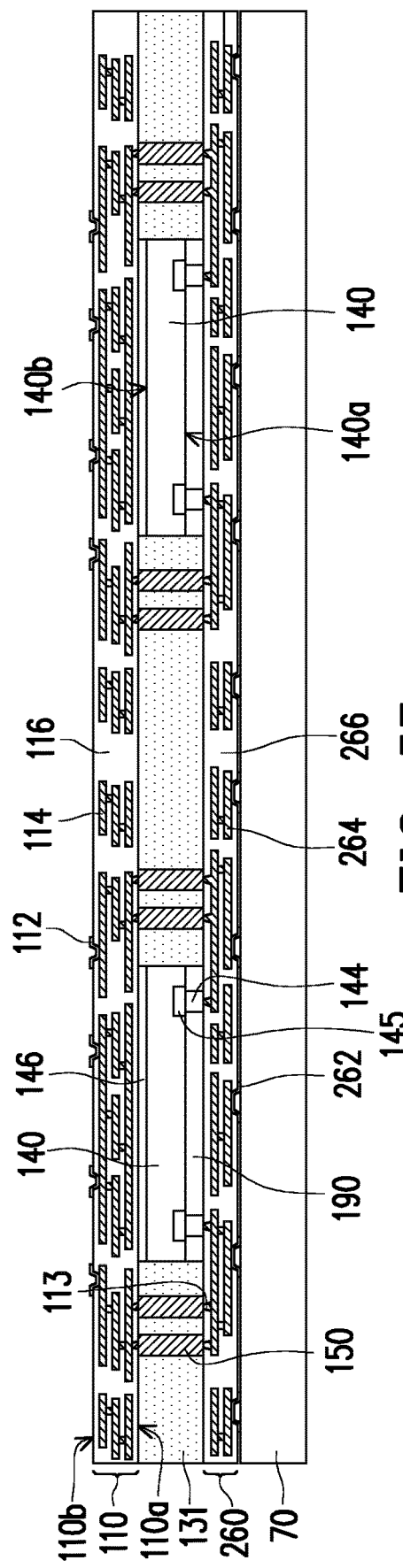

Referring to FIG. 5F, a plurality of the conductive terminals 112 is formed in the recesses on the second surface 110b of the first redistribution circuit structure 110 for the subsequent bumping processes.

Referring to FIG. 5G, a plurality of memory devices 120 are mounted onto the second surface 110b of the first redistribution circuit structure 110 and electrically connected thereto through the conductive terminals 112 through the flip-chip bonding process and the underfill process, for example. In some embodiments, the memory devices 120 may include a plurality of bumps 122 bonded to the conductive terminals 112 on the second surface 110b of the first redistribution circuit structure 110 for electrically connecting the memory devices 120 to the first redistribution circuit structure 110. As shown in FIG. 5G, the underfill 180 may be filled between the memory devices and the first surface 110b of the first redistribution circuit structure 110 to cover and insulate the bumps 122 and the conductive terminals 112.

As illustrated in FIG. 5G, the rear surface of the integrated circuit 140 faces the memory devices, and the first redistribution circuit structure 110 disposed therebetween. In addition, the integrated circuit 140 is electrically connected to the memory devices 120 sequentially through the second redistribution circuit structure 260, the conductive pillars 150, and the first redistribution circuit structure 110.

Referring to FIG. 5H, the second insulating portion 132 of the insulating encapsulation 130 is formed on the second surface 110b of the first redistribution circuit structure 110 to encapsulate the entire memory devices 120. The second insulating portion 132, as illustrated in FIG. 5H, may be formed on the second surface 110b of the first redistribution circuit structure 110 by an over-molding process and a grinding process, so as to encapsulate the memory devices 120. In some embodiments, an insulating material is formed on the second surface 110b of the first redistribution circuit structure 110 to cover the memory devices entirely by the over-molding process, and the insulating material is then grinded by, for example, a mechanical grinding process and/or a chemical mechanical polishing (CMP) process until a desired thickness of the second insulating portion 132 has been reached. In some embodiments, the insulating material may be grinded until the top surfaces of the memory devices 120 are exposed.

Figure 5I:
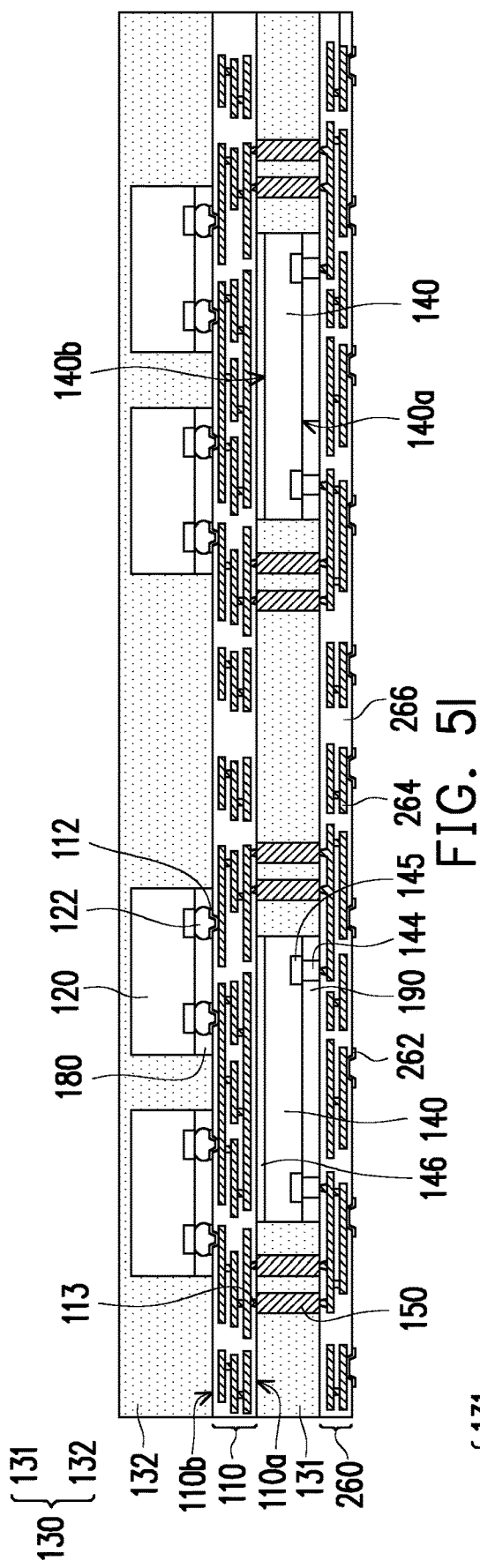

Referring to FIG. 5I, the carrier 70 is de-bonded from the surface of the second redistribution circuit structure 260, such that the conductive terminals 262 are exposed for the subsequent processes.

Figure 5J:
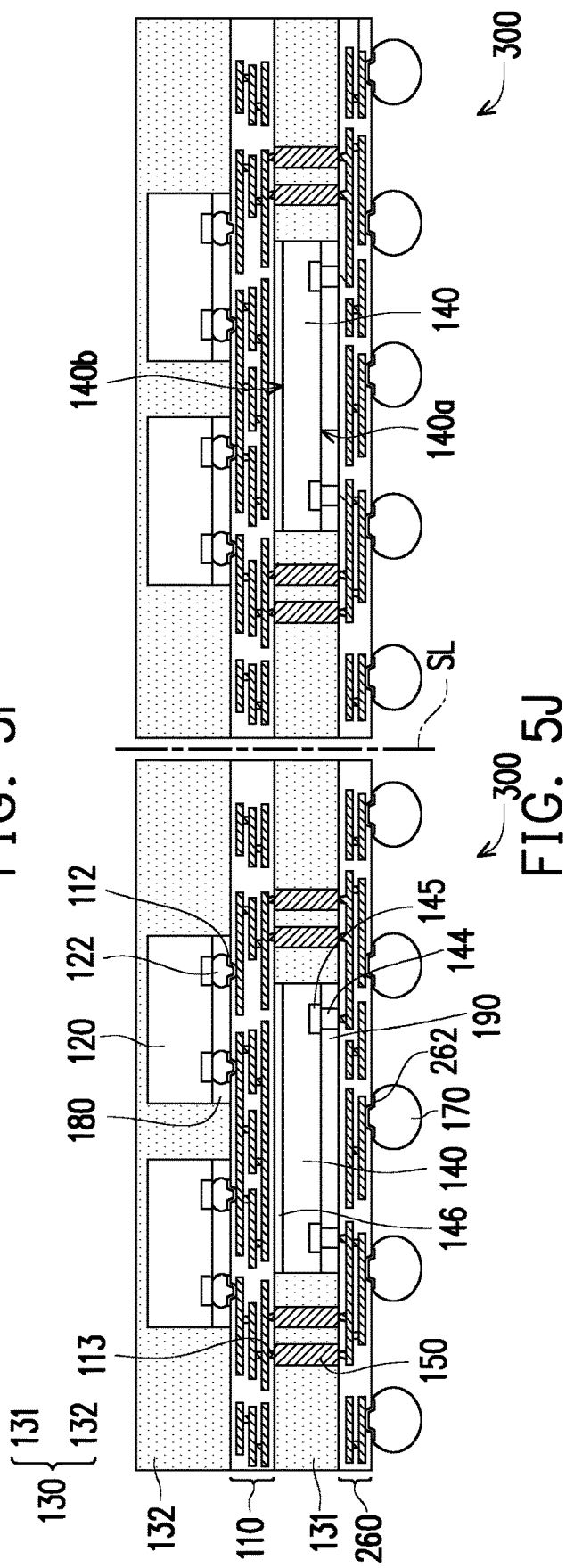

Referring to FIG. 5J, a dicing process is performed along the scribe line SL to singulate the resulted structure shown in FIG. 5J, so as to form a plurality of singulated packages 200. During the dicing process, the first redistribution circuit structure 110, the second redistribution circuit structure 260, and the insulating encapsulation 130 are sawed to form the singulated packages 200. In some embodiments, each singulated package 200 has an integrated circuit 140 and two memory devices 120 respectively disposed at the opposite sides of the first redistribution circuit structure 110. However, the numbers of the integrated circuit 140 and the memory devices 120 may be adjusted according to the practical needs. Moreover, the memory devices 120 and the integrated circuit 140 are relatively disposed in a face to back manner. As illustrated in FIG. 5J, the lateral sides of the first redistribution circuit structure 110, the lateral sides of the first insulating portion 131, and the lateral sides of the second insulating portion 132 are aligned with each other.

In accordance with some embodiments of the present disclosure, an integrated fan-out package including an integrated circuit, a plurality of semiconductor devices, a first redistribution circuit structure, and an insulating encapsulation is provided. The integrated circuit has an active surface and a rear surface opposite to the active surface. The semiconductor devices are electrically connected the integrated circuit. The first redistribution circuit structure is disposed between the integrated circuit and the semiconductor devices. The first redistribution circuit structure is electrically connected to the integrated circuit and the semiconductor devices respectively. The first redistribution circuit structure has a first surface, a second surface opposite to the first surface, and lateral sides between the first surface and the second surface. The insulating encapsulation encapsulates the integrated circuit and the semiconductor devices and covers the first surface and the second surface of the first redistribution circuit structure.

In accordance with alternative embodiments of the present disclosure, a method for fabricating integrated fan-out packages including the following steps is provided. A first redistribution circuit structure having a first surface and a second surface opposite to the first surface is provided. A plurality of semiconductor devices is mounted onto the second surface of the first redistribution circuit structure. An insulating encapsulation over the second surface of the first redistribution circuit structure is formed to encapsulate the semiconductor devices. The insulating encapsulation has a first insulating portion and a second insulating portion, and the second insulating portion encapsulates the semiconductor devices. An integrated circuit is formed over the first surface of the first redistribution circuit structure. The integrated circuit has an active surface and a rear surface opposite to the active surface, and the integrated circuit is electrically connected to the first redistribution circuit structure. A first insulating portion of the insulating encapsulation is formed over the first surface of the first redistribution circuit structure to encapsulate the integrated circuit.

In accordance with yet alternative embodiments of the present disclosure, a method for fabricating an integrated fan-out package including the following steps is provided. An integrated circuit is mounted onto a carrier. A first insulating portion of an insulating encapsulation is formed over the carrier to encapsulate the integrated circuit. A first redistribution circuit structure is formed over the integrated circuit and the first insulation port portion. The first redistribution circuit structure has a first surface and a second surface opposite to the first surface. The integrated circuit is disposed between the first surface and the carrier. A plurality of semiconductor devices is mounted on the second surface of the first redistribution circuit structure. A second insulating portion of the insulating encapsulation is formed over the second surface of the first redistribution circuit structure to encapsulate the semiconductor devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure, comprising:
   an integrated circuit having an active surface and a rear surface opposite to the active surface;
   a passivation layer disposed on the active surface of the integrated circuit and exposing a plurality of conductive pads of the integrated circuit;
   a plurality of semiconductor devices electrically connected to the integrated circuit;
   a first redistribution circuit structure disposed between the integrated circuit and the semiconductor devices and electrically connected to the integrated circuit and the semiconductor devices respectively, wherein the rear surface of the integrated circuit is attached to the first redistribution circuit structure; and
   an insulating encapsulation, comprising a first insulating portion encapsulating the integrated circuit and a second insulating portion encapsulating the semiconductor devices, wherein the plurality of conductive pads are spaced apart from the first insulating portion of the insulating encapsulation by the passivation layer, and rear surfaces of the semiconductor devices are covered by the second insulating portion of the insulating encapsulation, wherein the rear surfaces of the semiconductor devices faces away from the first redistribution circuit structure, and the first insulating portion and the second insulating portion are spatially apart from one another,
   wherein a sidewall of the first insulating portion, a sidewall of the first redistribution circuit structure and a sidewall of the second insulating portion are aligned with and connected to each other.

2. The structure as claimed in claim 1, wherein the first redistribution circuit structure has a first surface, a second surface opposite to the first surface and lateral sides between the first surface and the second surface, the first insulating portion and the second insulating portion are respectively disposed on the first surface and the second surface of the first redistribution circuit structure, and the integrated circuit and the semiconductor devices are respectively embedded in the first insulating portion and the second insulating portion.

3. The structure as claimed in claim 2, wherein a sidewall of the structure is substantially continuously planar sidewall comprising the sidewall of the first insulating portion, the sidewall of the first redistribution circuit structure and the sidewall of the second insulating portion.

4. The structure as claimed in claim 1, further comprising a die-attach film disposed between the integrated circuit and the first redistribution circuit structure, wherein the rear surface of the integrated circuit is attached to the first redistribution circuit structure through the die-attach film,
   wherein a vertical size of the first insulating portion is constant and is substantially equal to a sum of a vertical size of the integrated circuit, a vertical size of the passivation layer and a vertical size of the die-attach film.

5. The structure as claimed in claim 1, further comprising a second redistribution circuit structure, disposed over the first redistribution circuit structure, and the integrated circuit disposed between the first redistribution circuit structure and the second redistribution circuit structure, wherein a sidewall of the second redistribution circuit structure, the sidewall of the first insulating portion, the sidewall of the first redistribution circuit structure and the sidewall of the second insulating portion are aligned with and connected to each other.

6. The structure as claimed in claim 5, wherein the active surface of the integrated circuit faces the second redistribution circuit structure, and the integrated circuit is electrically connected to the second redistribution circuit through a plurality of bumps disposed on the plurality of pads exposed by the passive layer between the active surface of the integrated circuit and the second redistribution circuit structure, the plurality of bumps is separated from the first insulating portion from the passivation layer,
   wherein a vertical size of the passivation layer is substantially equal to a vertical size of each of the plurality of bumps, and a vertical size of the integrated circuit is less than the vertical size of the each of the plurality of bumps.

7. The structure as claimed in claim 6, further comprising a plurality of conductive pillars disposed between and electrically connected to the first redistribution circuit structure and the second redistribution circuit structure, wherein the integrated circuit is electrically connected to the semiconductor devices sequentially through the second redistribution circuit structure, the conductive pillars, and the first redistribution circuit structure.

8. The structure as claimed in claim 5, further comprising a plurality of conductive terminals electrically connected to the second redistribution circuit structure, wherein the second redistribution circuit structure is disposed between the conductive terminals and the integrated circuit.

9. The structure as claimed in claim 8, further comprising a package circuit substrate, wherein the second redistribution circuit structure is electrically connected to the package circuit substrate through the conductive terminals.

10. The structure as claimed in claim 1, wherein sidewalls of the passivation layer are substantially aligned with sidewalls of the integrated circuit, and a top surface of the passivation layer is substantially coplanar to top surfaces of conductive pads and a top surface of the insulating encapsulation, wherein the passivation layer is a single-layer structure.

11. The structure as claimed in claim 1, further comprising a heat spreader disposed on the insulating encapsulation.

12. The structure as claimed in claim 1, wherein the integrated circuit comprises a system-on-chip, and each of the semiconductor devices comprises a memory device, a logic device, a power management integrated circuit (PMIC), an analog device, a sensor, an integrated passive device (IPD) or a discrete passive component.

13. A method, comprising:
providing, over a carrier, a first redistribution circuit structure having a first surface and a second surface opposite to the first surface;
mounting a plurality of semiconductor devices onto the second surface of the first redistribution circuit structure, wherein active surfaces of the semiconductor devices faces the second surface of the first redistribution circuit structure;
forming a first insulating portion of an insulating encapsulation over the second surface of the first redistribution circuit structure to encapsulate the semiconductor devices, rear surfaces of the semiconductor devices being covered by the first insulating portion of the insulating encapsulation, wherein the rear surfaces of the semiconductor devices are opposite to the active surfaces of the semiconductor devices;
debonding the carrier from the first redistribution circuit structure to accessibly reveal the first surface of the first redistribution circuit structure;
providing an integrated circuit over the first surface of the first redistribution circuit structure, wherein the integrated circuit has an active surface and a rear surface opposite to the active surface, the rear surface of the integrated circuit is attached to the first surface of the first redistribution circuit structure through a die-attach film, and the integrated circuit is electrically connected to the first redistribution circuit structure;
forming a passivation layer on the active surface of the integrated circuit, wherein the passivation layer exposes a plurality of conductive pads of the integrated circuit; and
forming a second insulating portion of the insulating encapsulation over the first surface of the first redistribution circuit structure to encapsulate the integrated circuit, wherein the plurality of conductive pads are spaced apart from the second insulating portion of the insulating encapsulation by the passivation layer and the first insulating portion and the second insulating portion are spatially apart from one another.

14. The method as claimed in claim 13, further comprising forming a second redistribution circuit structure over the first surface of the first redistribution circuit structure, and the integrated circuit disposed between the first redistribution circuit structure and the second redistribution circuit structure, wherein the active surface of the integrated circuit faces the second redistribution circuit structure, and the integrated circuit is electrically connected to the second redistribution circuit structure through a plurality of bumps disposed on the plurality of pads exposed by the passivation layer between the integrated circuit and the second redistribution circuit structure, wherein the plurality of bumps is separated from the first insulating portion from the passivation layer.

15. The method as claimed in claim 14, further comprising forming a plurality of conductive pillars between the first redistribution circuit structure and the second redistribution circuit structure, wherein the integrated circuit is electrically connected to the semiconductor devices sequentially through the second redistribution circuit structure, the conductive pillars, and the first redistribution circuit structure.

16. The method as claimed in claim 14, further comprising:
forming a plurality of conductive balls on the second redistribution circuit structure.

17. The method as claimed in claim 13, further comprising:
performing a dicing process to cut through the second redistribution circuit structure, the first insulating portion, the first redistribution circuit structure and the second insulating portion, wherein a sidewall of the second redistribution circuit structure, a sidewall of the first insulating portion, a sidewall of the first redistribution circuit structure and a sidewall of the second insulating portion together constitute a continuously planar sidewall of a semiconductor structure.

18. A method, comprising:
forming a first redistribution circuit structure on a carrier;
mounting an integrated circuit onto the first redistribution circuit structure through a die-attach film;
forming a first insulating portion of an insulating encapsulation over the carrier to encapsulate the integrated circuit and the die-attach film;
forming a second redistribution circuit structure over the integrated circuit and the first insulation portion;
transferring the first redistribution circuit structure, the integrated circuit, the first insulating portion, and the second redistribution circuit structure from the carrier to a substrate such that the first redistribution circuit structure is revealed;
mounting a plurality of semiconductor devices on the revealed first redistribution circuit structure;
encapsulating the semiconductor devices with a second insulating portion of the insulating encapsulation, rear surfaces of the semiconductor devices being in contact with the second insulating portion of the insulating encapsulation, wherein the rear surface of the semiconductor devices faces away from the revealed first redistribution circuit structure; and
removing the substrate after the semiconductor devices are encapsulated with the second insulating portion of the insulating encapsulation.

19. The method as claimed in claim 18, wherein the integrated circuit is disposed between the second redistribution circuit structure and the first redistribution circuit structure, an active surface of the integrated circuit faces the second redistribution circuit structure, and the integrated circuit is electrically connected to the second redistribution circuit structure through a plurality of bumps disposed between the integrated circuit and the second redistribution circuit structure.

20. The method as claimed in claim 19, further comprising forming a plurality of conductive pillars between the first redistribution circuit structure and the second redistribution circuit structure, wherein the integrated circuit is electrically connected to the semiconductor devices sequentially through the second redistribution circuit structure, the conductive pillars, and the first redistribution circuit structure.

* * * * *